US012564061B2

(12) United States Patent
Chang

(10) Patent No.: US 12,564,061 B2
(45) Date of Patent: Feb. 24, 2026

(54) GENERATION OF PHYSICALLY UNCLONABLE FUNCTION USING ONE-TIME-PROGRAMMABLE MEMORY DEVICES WITH BACK-END-OF-LINE TRANSISTORS

(71) Applicant: Taiwan Semiconductor Manufacturing Company, Ltd., Hsinchu (TW)

(72) Inventor: Meng-Sheng Chang, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 119 days.

(21) Appl. No.: 18/412,505

(22) Filed: Jan. 13, 2024

(65) Prior Publication Data

US 2025/0096160 A1     Mar. 20, 2025

Related U.S. Application Data

(60) Provisional application No. 63/582,630, filed on Sep. 14, 2023.

(51) Int. Cl.
H01L 23/00 (2006.01)
G11C 17/16 (2006.01)
G11C 17/18 (2006.01)
H10B 20/25 (2023.01)

(52) U.S. Cl.
CPC ............ H01L 23/573 (2013.01); G11C 17/16 (2013.01); G11C 17/18 (2013.01); H10B 20/25 (2023.02)

(58) Field of Classification Search
CPC ........ H10B 20/25; H10B 20/60; H10B 43/10; H10B 41/27; H10B 41/35; H10B 41/41; G11C 17/16; G11C 17/18; G11C 16/10; G11C 16/06; G11C 16/08; G11C 16/24; G11C 16/04; G11C 16/26; G11C 16/34; H01L 23/573; H01L 23/5252;
(Continued)

(56) References Cited

U.S. PATENT DOCUMENTS 11,404,426 B2 *   8/2022   Su ........................ G11C 17/146

FOREIGN PATENT DOCUMENTS

TW        200828324 A       7/2008
TW        201230050 A       7/2012
(Continued)

OTHER PUBLICATIONS

Office Action issued in Taiwan Appl. No. 113120713 dated Apr. 10, 2025.

*Primary Examiner* — Thong Q Le
(74) *Attorney, Agent, or Firm* — Foley & Lardner LLP

(57)     ABSTRACT
A memory device includes an anti-fuse memory cell that randomly presents either a first logic state or a second logic state. The memory cell is formed on a frontside of a substrate and at least includes a first programming transistor that is formed in a first one of a plurality of metallization layers disposed over the frontside and gated by a first programming word line, and a first reading transistor that is formed in a second one of the plurality of metallization layers disposed over the frontside or along a major surface on the frontside, coupled to the first programming transistor and a first bit line in series, and gated by a first reading word line.

20 Claims, 17 Drawing Sheets

(58) Field of Classification Search
CPC . H01L 23/5283; H01L 23/5286; G06F 21/73;
G06F 21/76
See application file for complete search history.

(56) References Cited

FOREIGN PATENT DOCUMENTS

| TW | 201833922 A | 9/2018 |
| TW | 202131456 A | 8/2021 |

\* cited by examiner

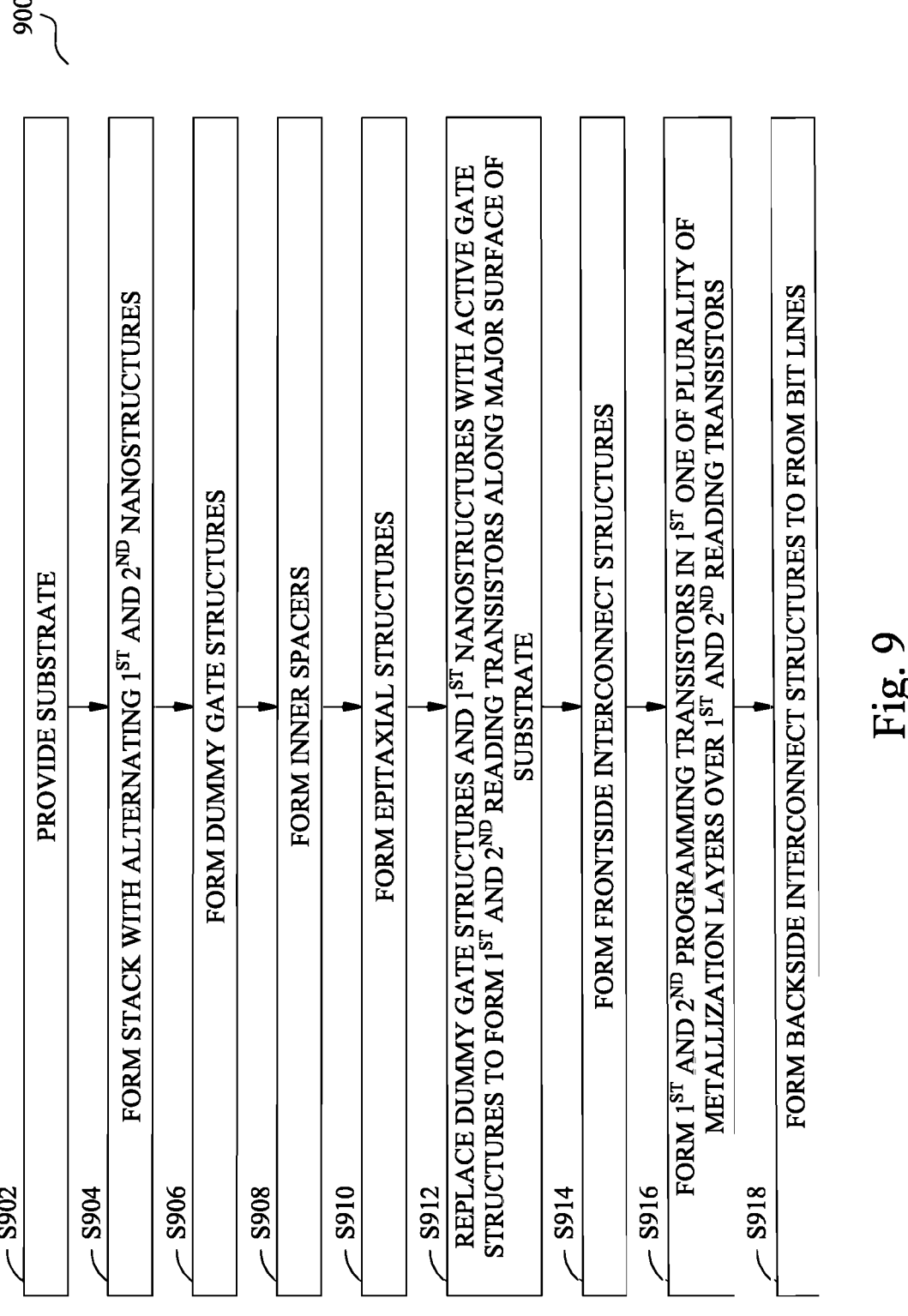

900

S902   PROVIDE SUBSTRATE

S904   FORM STACK WITH ALTERNATING 1ST AND 2ND NANOSTRUCTURES

S906   FORM DUMMY GATE STRUCTURES

S908   FORM INNER SPACERS

S910   FORM EPITAXIAL STRUCTURES

S912   REPLACE DUMMY GATE STRUCTURES AND 1ST NANOSTRUCTURES WITH ACTIVE GATE STRUCTURES TO FORM 1ST AND 2ND READING TRANSISTORS ALONG MAJOR SURFACE OF SUBSTRATE

S914   FORM FRONTSIDE INTERCONNECT STRUCTURES

S916   FORM 1ST AND 2ND PROGRAMMING TRANSISTORS IN 1ST ONE OF PLURALITY OF METALLIZATION LAYERS OVER 1ST AND 2ND READING TRANSISTORS

S918   FORM BACKSIDE INTERCONNECT STRUCTURES TO FROM BIT LINES

Fig. 9

GENERATION OF PHYSICALLY UNCLONABLE FUNCTION USING ONE-TIME-PROGRAMMABLE MEMORY DEVICES WITH BACK-END-OF-LINE TRANSISTORS

CROSS-REFERENCE TO RELATED APPLICATION

This application claims priority to and the benefit of U.S. Provisional Application No. 63/582,630, filed Sep. 14, 2023, entitled "PUF MEMORY DEVICES," which is incorporated herein by reference in its entirety for all purposes.

BACKGROUND

Integrated circuits (ICs) sometimes include one-time-programmable (OTP) memories to provide non-volatile memory (NVM) in which data is not lost when the IC is powered off. One type of the OTP devices includes anti-fuse memories. The anti-fuse memories include a number of anti-fuse memory cells (or bit cells), whose terminals are disconnected before programming, and are shorted (e.g., connected) after the programming. The anti-fuse memories may be based on metal-oxide-semiconductor (MOS) technology. For example, an anti-fuse memory cell may include a programming MOS transistor (or MOS capacitor) and at least one reading MOS transistor coupled in series. A gate dielectric of the programming MOS transistor may be broken down to cause the gate and the source/drain of the programming MOS transistor to be interconnected. Depending on whether the gate dielectric of the programming MOS transistor is broken down, different data bits can be presented by the anti-fuse memory cell through reading a resultant current flowing through the programming MOS transistor and reading MOS transistor. The anti-fuse memories have the advantage of reverse-engineering proofing since the programming states of the anti-fuse cells cannot be determined through reverse engineering.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 9 illustrates a flow chart of a method of fabricating a memory device as shown in FIG. 4 in accordance with some embodiments.

DETAILED DESCRIPTION

Figure 1A:
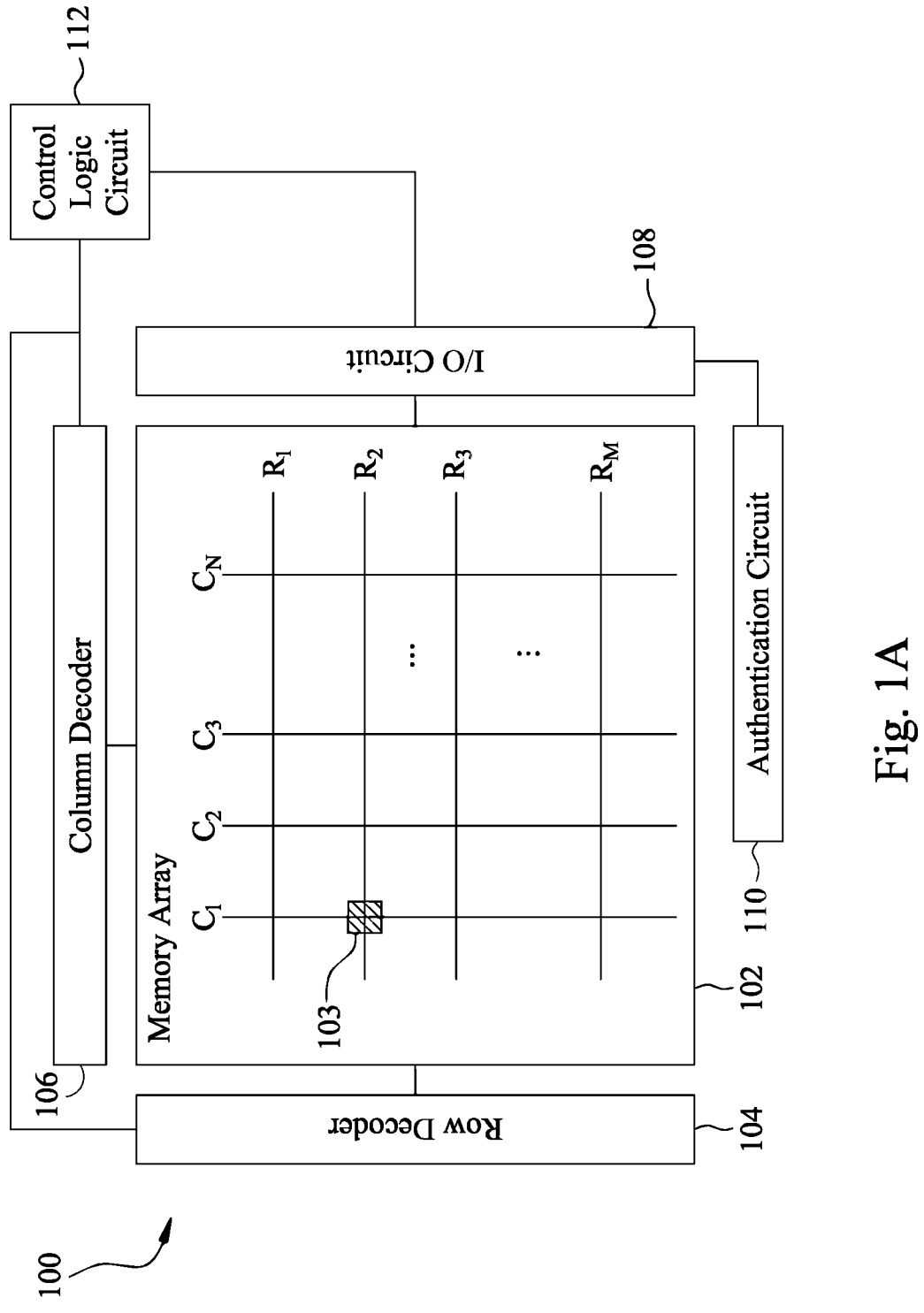
FIG. 1A illustrates a block diagram of an example memory system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A physically unclonable function (PUF) is generally used for authentication and secret key storage without requiring secure electrically erasable programmable read-only memory (EEPROMs) and/or other expensive hardware (e.g., battery-backed static random-access memory). Instead of storing secrets in a digital memory, the PUF derives a secret information from physical characteristics of an integrated circuit (IC). The PUF is based on an idea that even though an identical manufacturing process is used to fabricate a number of ICs, each IC may be slightly different from one another due to manufacturing variability. PUFs leverage this variability to derive "secret" information that is unique to each of the ICs (e.g., a silicon biometric). Generally, such a secret information is referred to as a "PUF signature" of the IC. In addition, due to the manufacturing variability that defines the PUF signature, one cannot manufacture two identical ICs even with full knowledge of the IC's design. Various types of variability of an IC can be used to define such a signature.

Embodiments of the present disclosure provide various systems and methods to generate and read at least a bit of a PUF signature (or a PUF bit) for/from a memory device that includes a number of memory cells. In some embodiments, each of the memory cells is implemented as an anti-fuse cell that includes a first and a second programming transistors and a first and a second reading transistors, in which the first programming transistor and the first reading transistor are coupled in series, and the second programming transistor and the second reading transistor are coupled in series. Even though the first and the second programming transistors are formed in the same dimensions and the same material, while being concurrently with the same level of a programming voltage, one of the first and the second programming transistors can precede the other to be broken down by the programming voltage, according to various embodiments. Upon one of the first and the second programming transistors being broken down, the programming process may stop. As such, one of the two programming transistors can be randomly programmed. Based on which of the two programming transistors is broken down first, the disclosed system generates at least one PUF bit for/from the memory device. Applying the same principle over all of the memory cells, the disclosed system can generate a unique PUF signature for/from the memory device.

In some embodiments, the first and the second reading transistors are formed along a major surface of a frontside of the substrate in a front-end-of-line (FEOL) network, while the first and the second programming transistors are formed in one of metallization layers that is disposed over the first and the second reading transistors in a back-end-of-line (BEOL) network, thereby leading to reduced memory cell area and reduced programming voltage.

FIG. 1A illustrates a memory system 100 in accordance with various embodiments. In the illustrated embodiment of FIG. 1A, the memory system 100 includes a memory array 102, a row decoder 104, a column decoder 106, an input/output (I/O) circuit 108, an authentication circuit 110, and a control logic circuit 112. Despite not being shown in FIG. 1A, all of the components of the memory system 100 may be coupled to each other and to the control logic circuit 112. Although, in the illustrated embodiment of FIG. 1A, each component is shown as a separate block for the purpose of clear illustration, in other embodiments, some or all of the components shown in FIG. 1A may be integrated together. For example, the memory array 102 may include an embedded authentication circuit (e.g., 110).

The memory array 102 is a hardware component that stores data. In one aspect, the memory array 102 is implemented as a semiconductor memory device. The memory array 102 includes a plurality of memory cells (or storage units) 103. The memory array 102 includes a number of rows $R_1$, $R_2$, $R_3$ . . . . $R_M$, each extending in a first direction (e.g., X-direction) and a number of columns $C_1$, $C_2$, $C_3$ . . . . $C_N$, each extending in a second direction (e.g., Y-direction). Each of the rows/columns may include one or more conductive structures function as access lines. In some embodiments, each memory cell 103 is arranged in the intersection of a corresponding row and a corresponding column, and can be operated according to voltages or currents through the respective conductive structures of the column and row.

In some embodiments, each memory cell 103 is implemented as an anti-fuse memory cell including a first and a second programming transistors, and a first and a second reading transistors. The first programming and the first reading transistors are coupled in series, and the second programming and the second reading transistors are coupled in series. The first and the second reading transistors can be concurrently or respectively turned on/off to enable/disable an access (e.g., program or read) to the respective (first and second) programming transistors. For example, upon being enabled, the two programming transistors can be programmed at the same time (e.g., by commonly applying a programming voltage). Randomly, one of the programming transistors can be broken down faster than the other, and thus a logic state of the memory cell can be determined based on which of the two programming transistors has been broken down. Such randomly determined logic states of the memory cells can constitute the basis of a PUF signature. Detailed descriptions on configurations and operations of the memory cell 103 to generate a PUF signature will be discussed below with respect to FIGS. 2A-2C and 3.

The row decoder 104 is a hardware component that can receive a row address of the memory array 102 and assert a conductive structure (e.g., a word line) at that row address. The column decoder 106 is a hardware component that can receive a column address of the memory array 102 and assert one or more conductive structures (e.g., a pair of source lines) at that column address. The I/O circuit 108 is a hardware component that can access (e.g., read or program) each of the memory cells 103 asserted through the row decoder 104 and column decoder 106. The authentication circuit 110 is a hardware component that can generate a PUF signature based on respective logic states of the memory cells read by the I/O circuit 108. The control logic circuit 112 is a hardware component that can control the coupled components (e.g., 102 through 110).

Figure 1B:
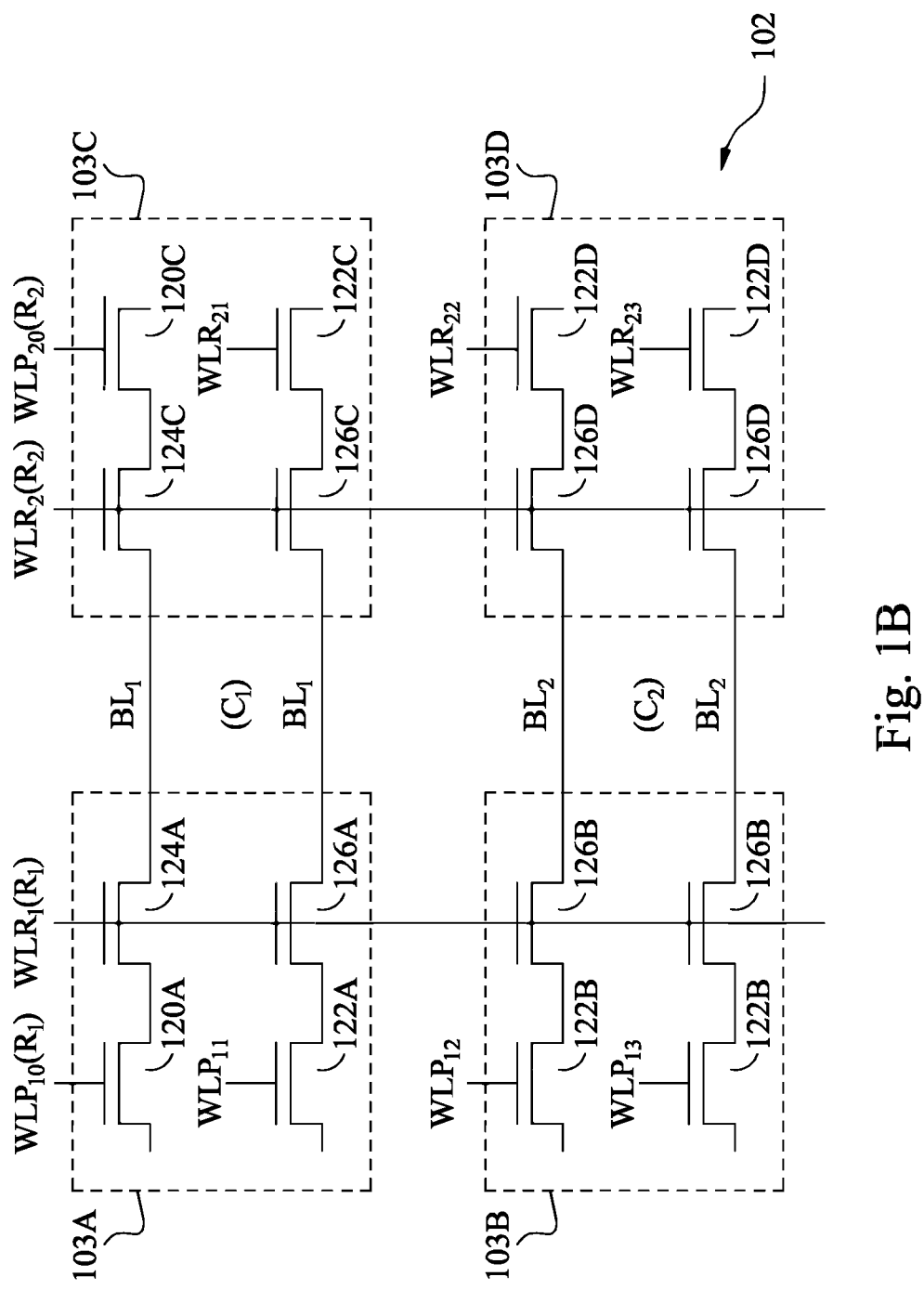
FIG. 1B illustrates an example circuit diagram of a portion of a memory array of the memory system of FIG. 1A in accordance with some embodiments.

FIG. 1B illustrates an example circuit diagram of a portion of the memory device 100 (e.g., some memory cells 103) in accordance with some embodiments. In the illustrated example of FIG. 1B, anti-fuse memory cells 103A, 103B, 103C and 103D of the memory array 102 are shown. It should be appreciated that the memory array 102 can have any number of anti-fuse memory cells 103, while remaining within the scope of present disclosure.

As mentioned above, the memory cells 103 can be arranged as an array. As shown in FIG. 1B, the memory cells 103A and 103B may be disposed in a same row but in respectively different columns; and the memory cells 103C and 103D may be disposed in a same row but in respectively different columns. For example, the memory cells 103A and 103B are disposed in the same row $R_1$, but in different columns $C_1$ and $C_2$, respectively; and the memory cells 103C and 103D are disposed in the same row $R_2$, but in different columns $C_1$ and $C_2$, respectively. With such a configuration, each of the memory cells can be operatively coupled to the access lines in the corresponding row and column, respectively.

For example in FIG. 1B, the memory cell 103A is operatively coupled to a first programming word line, a second programming word line, and a reading word line in row $R_1$ (hereinafter $WLP_{10}$, $WLP_{11}$ and $WLR_1$, respectively) and to a bit line in column $C_1$ (hereinafter $BL_1$); the memory cell 103B is operatively coupled to a third programming word line (hereinafter $WLP_{12}$), a fourth programming word line (hereinafter $WLP_{13}$), and the reading word line $WLR_1$ in row $R_1$ and to a bit line in column $C_2$ (hereinafter $BL_2$); the memory cell 103C is operatively coupled to a first programming word line, a second programming word line, and a reading word line in row $R_2$ (hereinafter $WLP_{20}$, $WLP_{21}$ and $WLR_2$, respectively) and to the bit line $BL_1$ in column $C_1$; and the memory cell 103D is operatively coupled to a third programming word line (hereinafter $WLP_{22}$), a fourth programming word line (hereinafter $WLP_{23}$), and the reading word line $WLR_2$ in row $R_2$ and to the bit line $BL_2$ in column $C_2$.

In some embodiments, each of the memory cells 103A through 103D can be operatively coupled to the I/O circuit 108 through the respective WLR, WLP, and BL for being accessed (e.g., programmed or read). For example, the I/O circuit 108 can cause the row decoder 104 to assert the $WLP_{10}$, $WLP_{11}$, and $WLR_1$ and the column decoder 106 to assert the $BL_1$, so as to access the memory cell 103A. Accordingly, each of the memory cells 103A-D can be individually selected to be programmed. Details about programming and reading the memory cell will be discussed in further detail below.

Each of the memory cells 103A through 103D includes a number of programming transistors and a number of reading transistors, in which each of the programming transistors is coupled to a corresponding one of the reading transistors in series. Further, the programming transistors are separately gated, while the reading transistors may or may not be commonly gated in accordance with various embodiments. In some embodiments, as shown in FIG. 1B, the reading transistors disposed along the same row are commonly gated. The memory cell 103A is selected as a representative example in the following discussions.

As shown in FIG. 1B, the memory cell 103A includes two programming transistors 120A and 122A, and two reading transistors 124A and 126A. The programming transistor 120A is coupled to the reading transistor 124A in series; and the programming transistor 122A is coupled to the reading transistor 126A in series. One source/drain terminal of each of the programming transistors 120A and 122A is floating (i.e., not connected to any other functioning features); and the other source/drain terminal of each of the programming transistors 120A and 122A is serially coupled to one source/drain terminal of the corresponding reading transistor 124A/126A, with the other source/drain terminals of the reading transistors 124A and 126A commonly coupled to the $BL_1$.

Specifically, the programming transistor 120A is gated by the $WLP_{10}$ (i.e., a gate terminal of the programming transistor 120A is coupled to the $WLP_{10}$), and the programming transistor 122A is gated by the $WLP_{11}$ (i.e., a gate terminal of the programming transistor 122A is coupled to the $WLP_{11}$). The reading transistors 124A and 126A are both gated by the $WLR_1$ (i.e., both gate terminals of the reading transistors 124A and 126A are coupled to the $WLR_1$). However, it should be understood that the gate terminals of the reading transistors 124A and 126A may be coupled to respective different WLRs. In some embodiments, the gate terminals (formed as gate structures as discussed below) of the programming transistors 120A and 122A may be isolated from each other by forming a dielectric structure interposed between the gate structures (not shown).

Each of other memory cells (e.g., 103B, 103C and 103D) is configured substantially the same as the memory cell 103A, and thus the memory cells 103B through 103D are briefly described as follows. The memory cell 103B includes programming transistors 120B and 122B gated by $WLP_{12}$ and $WLP_{13}$ respectively, and the reading transistors 124B and 126B gated by $WLR_1$; the memory cell 103C includes programming transistors 120C and 122C gated by $WLP_{20}$ and $WLP_{21}$ respectively, and the reading transistors 124C and 126C gated by $WLR_2$; and the memory cell 103D includes programming transistors 120D and 122D gated by $WLP_{22}$ and $WLP_{23}$ respectively, and the reading transistors 124D and 126D gated by $WLR_2$.

Figure 2A:
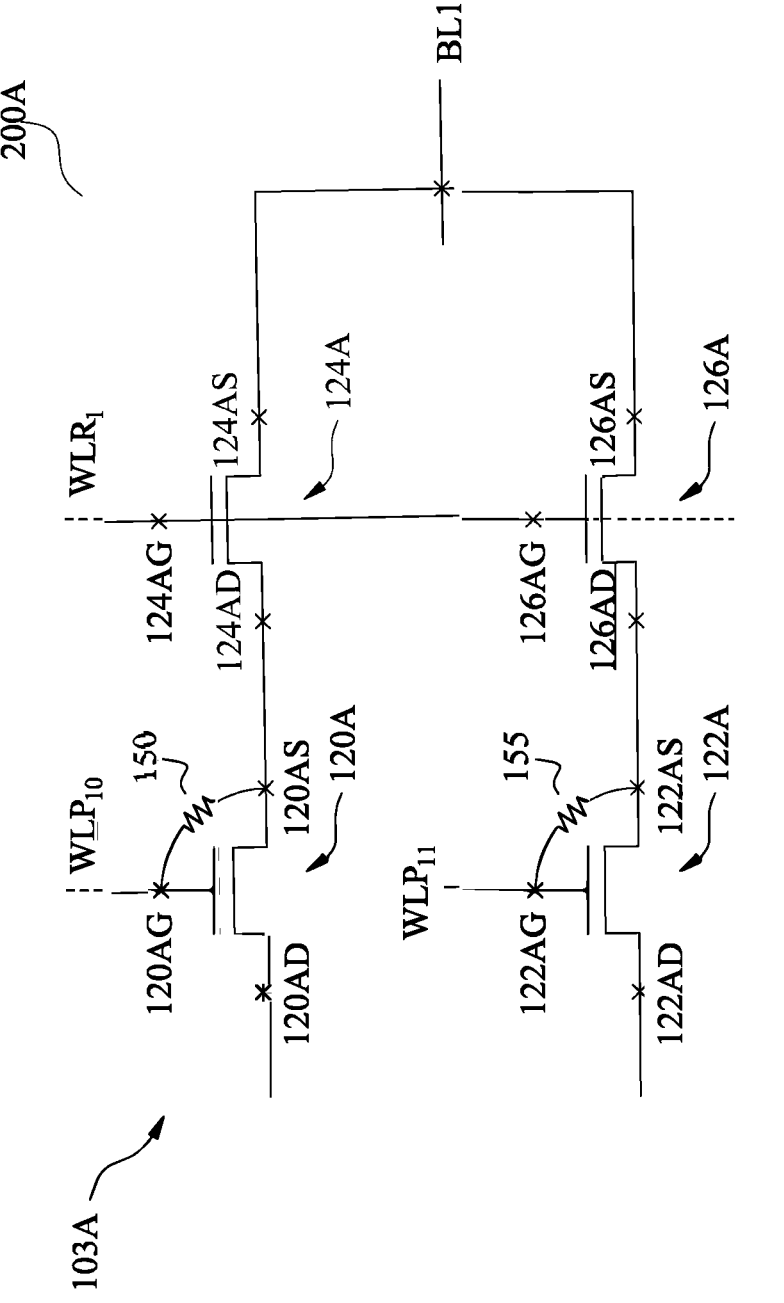
FIG. 2A illustrates an example circuit diagram of a memory cell of the memory array of FIGS. 1A-B in accordance with some embodiments.

Referring to FIG. 2A, provided is an example circuit diagram 200A of the memory cell 103A to illustrate operations of each of the memory cells 103 according to some embodiments. As shown, each of the programming/reading transistors 120A to 126A may include an n-type metal-oxide-semiconductor field-effect-transistor (n-type MOS-FET) or referred to as an NMOS transistor. However, it should be understood that each of the programming/reading transistors 120A to 126A may include a p-type metal-oxide-semiconductor field-effect-transistor (p-type MOSFET), while remaining within the scope of present disclosure.

Specifically, the programming transistors 120A and 122A have their drain terminals 120AD and 122AD floating (e.g., coupled to nothing functional), and their source terminals 120AS and 122AS coupled to drain terminals 124AD and 126AD of the reading transistors 124A and 126A, respectively. Source terminals 124AS and 126AS of the reading transistors 124A and 126A are commonly coupled to the $BL_1$. The programming transistor 120A has its gate terminal 120AG coupled to the $WLP_{10}$, and the programming transistor 122A has its gate terminal 122AG coupled to the $WLP_{11}$. On the other hand, the reading transistors 124A and 126A have their gate terminals 124AG and 126AG commonly coupled to the $WLR_1$.

To program the memory cell 103A, the reading transistors 124A and 126A are turned on by supplying a high enough voltage (e.g., a positive voltage corresponding to a logic high state) to their gate terminals 124AG and 126AG via the $WLR_1$. Prior to, concurrently with, or subsequently to the reading transistors 124A and 126A being turned on, a high enough voltage (e.g., a breakdown voltage ($V_{BD}$), referred to as a programming voltage) is concurrently applied to the $WLP_{10}$ and $WLP_{11}$, and a low enough voltage (e.g., a positive voltage or ground voltage corresponding to a logic low state) is applied to the $BL_1$. The low enough voltage (applied on the $BL_1$) can be passed to the source terminal 120AS and 122AS. As such, that $V_{BD}$ can be concurrently present across the source terminal 120AS and the gate terminal 120AG of the programming transistor 120A and across the source terminal 122AS and the gate terminal 122AG of the programming transistor 122A.

Due to processing variability, even though these two programming transistors 120A and 122A are formed of the same materials (e.g., the same dielectric film) and made in identical dimensions, one of the two programming transistors should be broken down faster than the other programming transistors. Specifically, either a portion of a gate dielectric layer (e.g., the portion between the source terminal 120AS and the gate terminal 120AG) of the programming transistor 120A or a portion of a gate dielectric layer (e.g., the portion between the source terminal 122AS and the gate terminal 122AG) of the programming transistor 122A will be precedingly broken down. As the gate terminal 120AG of the programming transistor 120A and the gate terminal 122AG of the programming transistor 122A are isolated from each other, such a preceding breakdown can randomly and individually occur.

After the gate dielectric layer of the programming transistor 120A or 122A is broken down, a behavior of the portion of the gate dielectric layer interconnecting the gate terminal 120AG/122AG and the source terminal 120AS/122AS is equivalently resistive. For example, such a portion of the gate dielectric layer of the programming transistor 120A (if broken down first) may function as a resistor 150, while such a portion of the gate dielectric layer of the programming transistor 122A (if broken down first) may function as a resistor 155, as shown in FIG. 2A. Before the programming (e.g., before the gate dielectric layer of either of the programming transistors 120A or 122A is broken down), no conduction path exists between the $BL_1$ and any of the $WLP_{10}$ and $WLP_{11}$, even if the reading transistors 124A and 126A are turned on. After the programming, a conduction path exists either between the $BL_1$ and the $WLP_{10}$ (e.g., via the resistor 150) or between the $BL_1$ and the $WLP_{11}$ (e.g., via the resistor 155), when the reading transistors 124A and 126A are turned on.

Upon a breakdown occurs to one of the programming transistors 120A and 122A, a conduction path is established. In an example where the programming transistor 120A is broken down first, a sudden increase of voltage can be present on the source terminal 120AS, which can induce a sudden increase of voltage on $BL_1$. Accordingly, a voltage level at the source terminal 122AS of the programming transistor 122A can be increased such that the programming process on the transistor 122A can be automatically stopped (as a voltage drop across its gate and source terminals is decreased). Consequently, the memory cell 103A can be "randomly" programmed to a first logic state or a second logic state. Whether the first or second logic state is programmed into the memory cell can correspond to which of the programming transistors is broken down (first), which may be determined based on a further reading process.

In some embodiments, the reading process includes concurrently applying a relatively low level of a voltage (referred to as a reading voltage) on these two programming transistors, an observable decrease of reading voltage may be present on the broken-down programming transistor, while the reading voltage applied on the non-broken-down programming transistor may remain substantially unchanged. In the above example where the programming transistor 120A is broken down (while the programming transistor 122A remains intact), the reading voltage applied on $WLP_{10}$ may be observed as lower than the reading voltage applied on $WLP_{11}$. As such, a logic state of the cell 103A (a PUF bit) can be determined accordingly. Based on such a randomly programmed logic state on each of the memory cells, a PUF signature (formed of various PUF bits of the memory cells) can be generated.

Figure 2B:
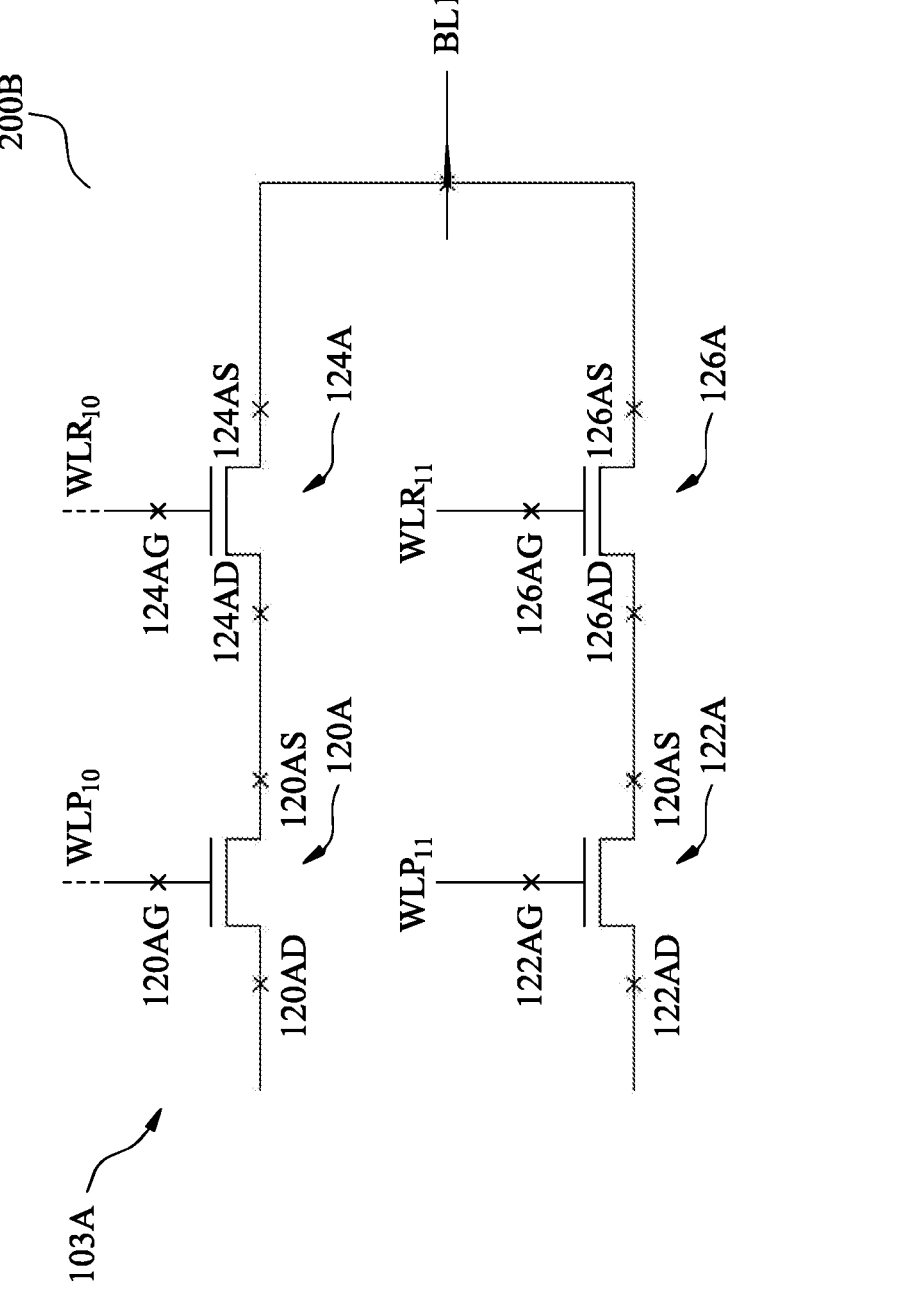
FIG. 2B illustrates another example circuit diagram of the memory cell of the memory array of FIG. 2A in accordance with some embodiments.

FIG. 2B illustrates another example circuit diagram 200B of the memory cell 103A, in accordance with some embodiments. The circuit diagram of FIG. 2B is substantially similar to the circuit diagram of FIG. 2A except that the two reading transistors 124A and 126A are gated by respective different $WLR_{10}$ and $WLR_{11}$. Thus, the discussions will not be repeated.

Figure 2C:
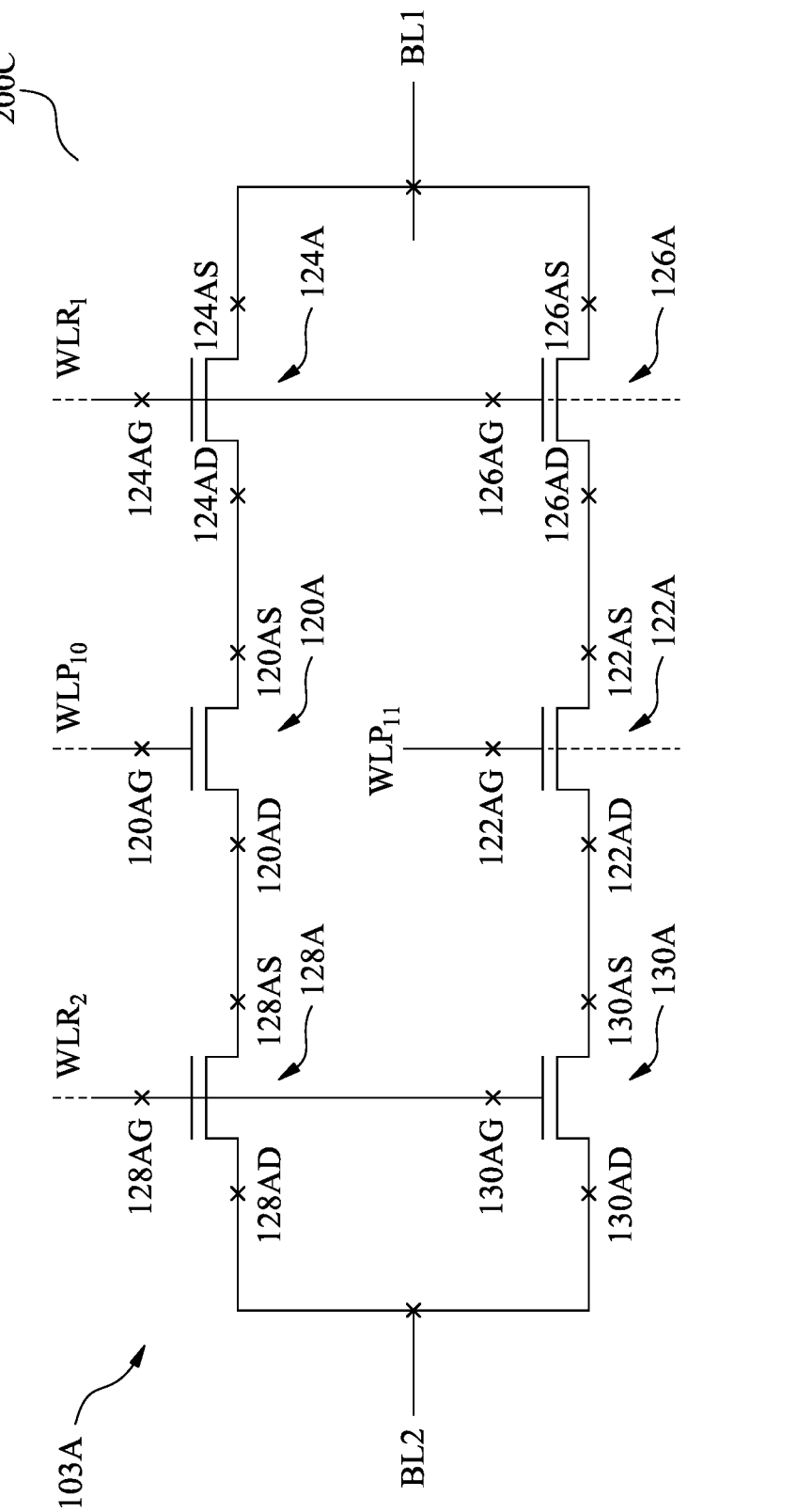
FIG. 2C illustrates an example circuit diagram of a memory cell of the memory array of FIG. 1A in accordance with other embodiments.

FIG. 2C illustrates yet another example circuit diagram 200C of the memory cell 103A in accordance with some embodiments. The circuit diagram of FIG. 2C is substantially similar to the circuit diagram of FIG. 2A except that two additional reading transistors 128A and 130A are serially coupled to the programming transistors 120A and 122A as well as the reading transistors 124A and 126A, respectively. With such two additional reading transistors 128A and 130A, a read margin of the memory cell 103A may be improved. As shown, source terminals 128AS and 130AS of the reading transistors 128A and 130A are coupled to the drain terminals 120AD and 122AD, respectively. Source terminals of the reading transistors 124A and 126A are commonly coupled to the $BL_1$. The reading transistors 128A and 130A have their gate terminals 128AG and 130AG commonly coupled to another reading word line $WLR_2$. However, it should be understood that the gate terminals 128AG and 130AG can be coupled to respective different reading word lines, while remaining within the scope of present disclosure.

Figure 3:
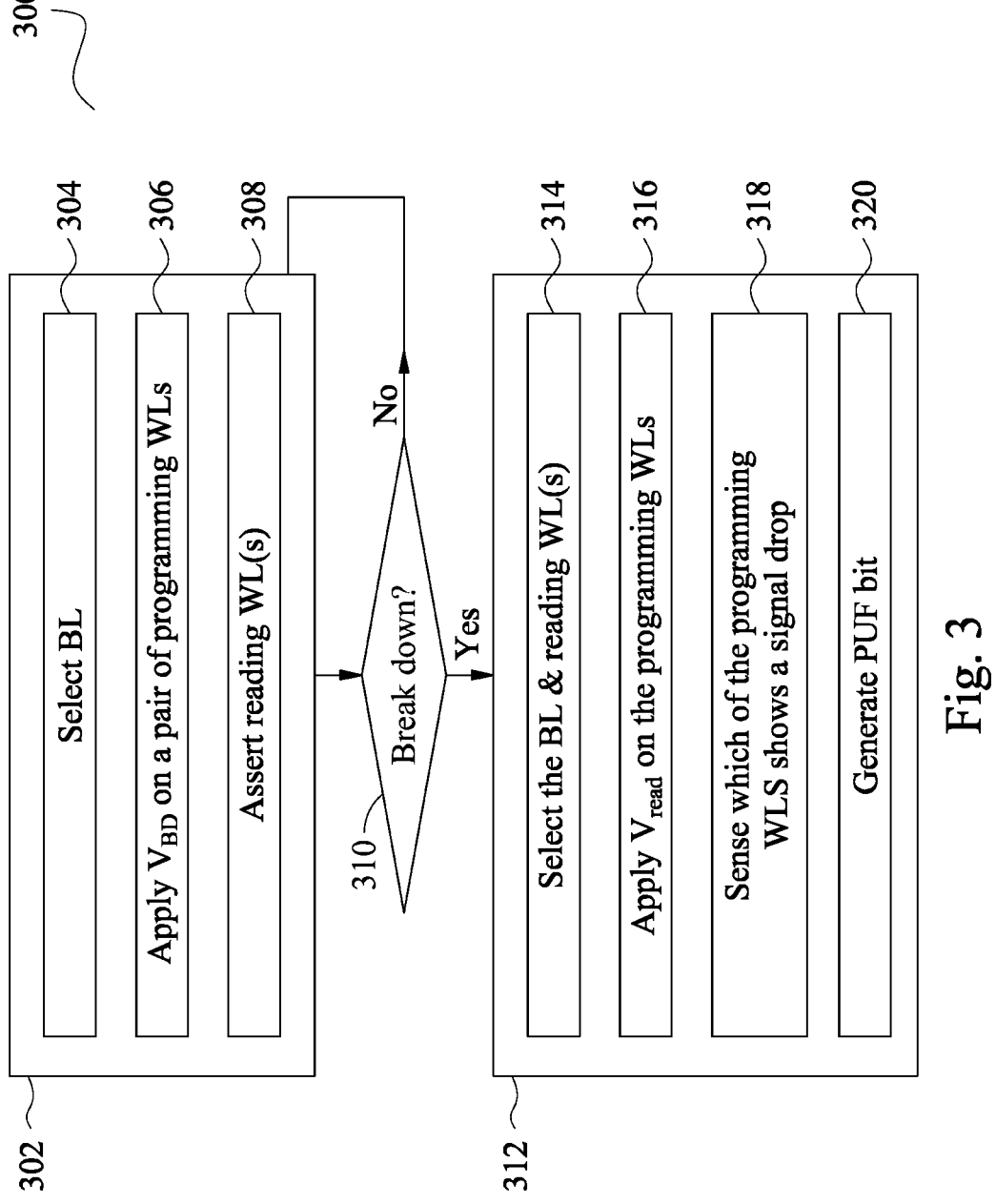
FIG. 3 illustrates a flow chart of an example method of operating the memory system of FIG. 1A in accordance with some embodiments.

FIG. 3 illustrates an exemplary flow chart of a method 300 of generating a PUF signature based on an anti-fuse memory cell including a pair of programming transistors and a pair of reading transistors in accordance with various embodiments. For purposes of discussion, the following embodiment of the method 300 will be described in conjunction with FIGS. 1A-2C (e.g., the memory cell 103A of FIG. 2A). The illustrated embodiment of the method 300 is merely an example so that any of a variety of operations may be omitted, re-sequenced, and/or added, while remaining within the scope of the present disclosure.

The method 300 starts at operation 302 of a programing process. Specifically, operation 302 includes operation 304 in which a bit line is selected, operation 306 in which a pair of programming word lines are concurrently applied with a high programming voltage (e.g., $V_{BD}$), and operation 308 in which one or more reading word lines are asserted. It should be noted the sequence of operations 304 to 308 can be changed, while remaining within the scope of present disclosure. For example, operation 308 may be performed prior to operations 304 and 306.

Also referring to FIGS. 1A and 2A, in operation 304, the control logic circuit 112 can provide a column address for the column decoder 106 to select one of the columns $C_1$ to $C_N$ of the memory array 102. Upon selecting a column, the I/O circuit 108 can provide a voltage (e.g., a logic low voltage) to a BL arranged in the selected column, e.g., $BL_1$ in FIG. 2A. In some embodiments, the selected $BL_1$ may be pulled to ground. Next, the control logic circuit 112 can provide a row address for the row decoder 104 to select one of the rows $R_1$ to $R_M$ of the memory array 102. Upon selecting a row, the I/O circuit 108 can provide the programming voltage ($V_{BD}$) to a pair of programming word lines arranged in the selected row (operation 306), e.g., $WLP_{10}$ and $WLP_{11}$ of FIG. 2A, and the I/O circuit 108 can provide a voltage (e.g., corresponding to a logic high state) to a reading word line arranged in the selected row (operation 308), e.g., $WLR_1$ of FIG. 2A, thereby turning on the reading transistors 124A and 126A. As such, the memory cell (e.g., 103A) arranged in the intersection of the selected column and row can be programmed.

Next, the method 300 proceeds to operation 310 to determine whether or not one of the programming transistors of the selected memory cell has been broken down (i.e., programmed). If so, the method 300 proceeds to operation 312 including one or more reading processes; and if not, the method 300 proceeds back to operation 302 to perform the programing process again. In various embodiments, the I/O circuit 108 can determine whether the breakdown occurs to one of the programming transistors based on detecting a voltage increase present on the selected BL (e.g., $BL_1$), as discussed above.

Operation 312 further includes operation 314 in which the bit line and the reading word line are selected or asserted, operation 316 in which the pair of programming word lines are concurrently applied with a relatively low reading voltage ($V_{read}$), operation 318 to sense which of the programming word lines shows a signal decrease, and operation 320 in which a PUF bit is generated.

Referring first to operation 314, the control logic circuit 112 can provide a column address for the column decoder 106 to select one of the columns $C_1$ to $C_N$ of the memory array 102 and provide a row address for the row decoder 104 to select one of the rows $R_1$ to $R_M$ of the memory array 102.

In some embodiments, the column and row asserted in operation 314 is the same as the column asserted in operation 304 and the row asserted in operation 308, respectively. As a result, $BL_1$ is again pulled to ground, and the reading transistors 124A and 126A are again turned on.

Referring next to operation 316, based on the selected row, the I/O circuit 108 can provide the $V_{read}$ to the programming word lines arranged in the selected row, e.g., both of $WLP_{10}$ and $WLP_{11}$ of FIG. 2A. Thus, the memory cell 103A can be read. Next in operation 318, the I/O circuit 108 can sense which of the $WLP_{10}$ and $WLP_{11}$, connected to the memory cell 103A, shows a signal drop as discussed above.

Consequently, the control logic circuit 112 can determine the logic state programmed into the memory cell 103A based on whether it is $WLP_{10}$ and $WLP_{11}$ that has the signal drop and provide such a logic state to the authentication circuit 110 to generate a PUF bit (operation 320). If the signal drop is present on $WLP_{10}$ (i.e., the programming transistor 120A has been broken down), the control logic circuit 112 can determine that a first logic state has been programmed into the memory cell 103A. If the signal drop is present on $WLP_{11}$ (i.e., the programming transistor 122A has been broken down), the control logic circuit 112 can determine that a second logic state has been programmed into the memory cell 103A.

Figure 4:
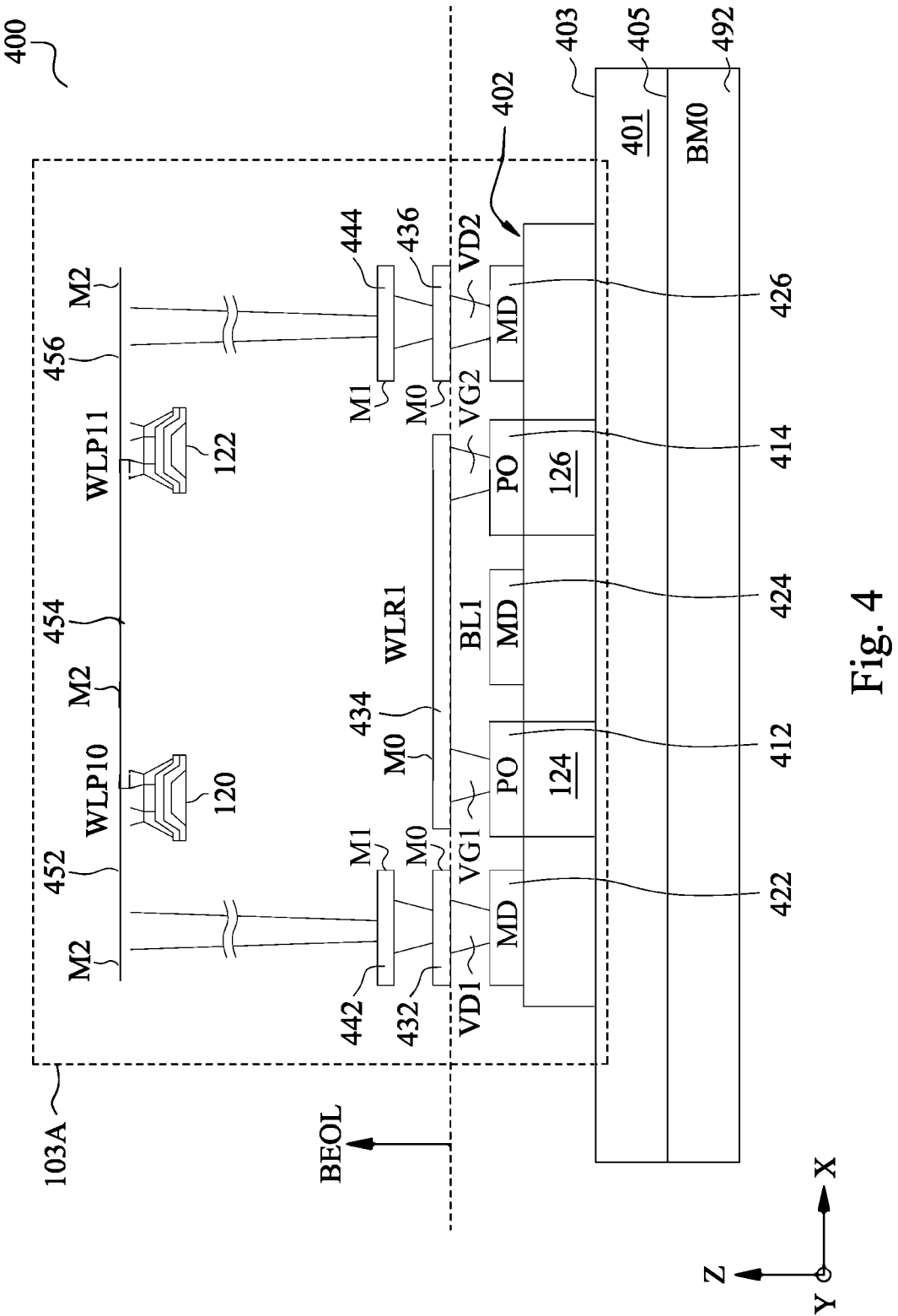
FIG. 4 illustrates a cross-sectional view of a memory device including a memory cell of FIGS. 2A-2B in accordance with some embodiments.

FIG. 4 illustrates a cross-sectional view of a memory device 400 including at least a memory cell 103A as shown in FIG. 2A in accordance with some embodiments. In some embodiments, the memory cell 103A is implemented according to the circuit diagram 200A of FIG. 2A (the "4T" configuration), and thus some references of FIG. 2A will be reused. The memory cell 103A is used as a representative example, however, the structure and configuration of each of the memory cells 103 in FIG. 1A can be the same as or similar to the memory cell 103A.

As shown in FIG. 4, the memory device 400 includes an anti-fuse memory cell 103A that is formed on a frontside 403 of a substrate 401 and at least includes a first programming transistor 120 and a second programming transistor 122 formed in a first one (e.g., M2) of a plurality of metallization layers (e.g., M0, M1, M2) disposed over the frontside 403 and respectively gated by a first programming word line (e.g., $WLP_{10}$) and a second programming word line (e.g., $WLP_{11}$); and a first reading transistor 124 and a second reading transistor 126 formed in a second one (e.g., M1) of the plurality of metallization layers (e.g., M0, M1, M2) disposed over the frontside or along a major surface on the frontside 403. The anti-fuse memory cell 103A randomly presents either a first logic state or a second logic state. In some embodiments, either a gate dielectric layer of the first programming transistor 120 or a gate dielectric layer of the second programming transistor 122 is randomly broken down to present the first logic state or the second logic state.

The first reading transistor 124 and the second reading transistor 126 are respectively coupled to the first programming transistor 120 and the second programming transistor 122 in series, commonly coupled to a first bit line $BL_1$, and commonly gated by a first reading word line (e.g., $WLR_1$). In some embodiments, the first bit line is formed in a third one (e.g., M0) of the plurality of metallization layers (e.g., M0, M1, M2) different from the first one and the second one of the plurality of metallization layers. In some embodiments, a source/drain terminal of the first programming transistor 120 and a source/drain terminal of the second programming transistor 122 are commonly coupled to each other and are floating.

Referring to FIG. 4, the memory device 400 includes a substrate 401 having a frontside 403 and a backside 405, an active region 402 formed along a major surface of the frontside surface 403 and extending in a first lateral direction (e.g., X direction), and a first gate structure 412 and a second gate structure 414 formed overlaying the active region 402 and extending in parallel in a second lateral direction (e.g., Y direction).

Such active regions and gate structures are referred to as part of "front-end-of-line (FEOL) processing/network," since they are formed along a major surface of the frontside 403 of the substrate 401. Immediately over the frontside surface of the substrate, a number of frontside metallization layers can be formed (referred to as part of "middle-end-of-line (MEOL) processing/network"). Over and further away from the major surface of the frontside of the substrate, a number of frontside metallization layers can be formed (referred to as part of "back-end-of-line (BEOL) processing/network"). Over the backside surface 405 of the substrate 401, a number of backside metallization layers (e.g., BM0) can be formed.

In some embodiments, the active region 402 is formed of a stack structure (not shown) protruding from the major surface of the frontside 403 of the substrate 401 in the FEOL network. The stack includes a number of semiconductor nanostructures (e.g., nanosheets) extending along the X-direction and vertically separated from each other. Portions of the semiconductor nanostructures in the stack that are overlaid by the gate structures 412 and 414 remain, while other portions are replaced with a number of epitaxial structures. The remaining portions of the semiconductor nanostructures can be configured as the channel of a corresponding transistor, the epitaxial structures coupled to both sides (or ends) of the remaining portions of the semiconductor nanostructures can be configured as source/drain structures (or terminals) of the transistor, and a portion of the gate structure that overlays (e.g., straddles) the remaining portions of the semiconductor nanostructures can be configured as a gate structures (or terminal) of the transistor.

As a representative example in FIG. 4, in the FEOL network, a portion of the active region 402 overlaid by the gate structure 412 can function as a channel of the first reading transistor 124 in FIG. 4. Portions of the active region 402 disposed on opposite sides of the gate structure 412 are replaced with epitaxial structures, and thus can function as the source/drain terminals of the first read transistor 124, respectively. The gate structure 412 can function as the gate terminal of the first read transistor 124. Similarly, a portion of the active region 402 overlaid by the gate structure 414 can function as a channel of the second reading transistor 126 in FIG. 4. Portions of the active region 402 that are disposed on opposite sides of the gate structure 414 are replaced with epitaxial structures, and thus can function as the source/drain terminals of the second reading transistor 126, respectively. The gate structure 414 can function as the gate terminal of the second reading transistor 126. In this way, in some embodiments, the first reading transistor 124 and the second reading transistor 126 in FIG. 4 are formed along the major surface of the frontside 403 of the substrate 401 in the FEOL network.

As shown in FIG. 4, in the MEOL network, a plurality of a middle-end interconnect structures (referred to as an MD, such as 422, 424 and 426) are formed over corresponding source/drain terminals of the first reading transistor 124 and the second reading transistor 126. A middle-end interconnect structure can connect a corresponding source/drain terminal to an upper interconnect structure through a middle-end via structure (referred to as a VD, such as VD1 and VD2). A gate structure can be coupled to an upper interconnect structure through another middle-end via structure (referred to as a VG, such as VG1 and VG2). As such, the gate structures 412 and 414 can be coupled to one or more metal tracks formed thereupon.

Above these middle-end structures on the frontside of the substrate, a number of metallization layers (e.g., M0, M1 and M2) can be formed, each of which includes a number of metal tracks or lines embedded in a corresponding dielectric material (e.g., inter-metal dielectric (IMD)/inter-layer dielectric (ILD)). For example, as shown in FIG. 4, the memory device 400 includes metal tracks 432, 434 and 436 in the M0 layer; metal tracks 442 and 444 in the M1 layer; and metal tracks 452, 454 and 456 in the M2 layer.

For example, the gate structure 412 is coupled to the M0 metal track 434 through VG1, and the gate structure 414 is coupled to the M0 metal track 434 through VG2. The MD 422, together with at least M0 metal track 432 and M1 metal track 442, can couple one of the source/drain terminals (e.g., an epitaxial structure) of the first reading transistor 124 to one end of M2 metal track 452; and the MD 426, together with at least M0 metal track 436 and M1 metal track 444, can couple one of the source/drain terminals (e.g., an epitaxial structure) of the second reading transistor 126 to one end of M2 metal track 456. The other ones of the source/drain terminals of the first reading transistor 124 and the second reading transistor 126 are commonly coupled to the MD 424 that functions as a bit line $BL_1$. The MD 424 is coupled to a supply voltage ($V_{SS}$) in some embodiments, and to the ground (GND) in other embodiments.

As shown in FIG. 4, the memory device 400 further includes a metal track 492 in a first backside metallization layer (referred to as "BM0 track 492"), which is the bottommost metallization layer with respect to the backside surface 405 of the substrate 401. For the sake of simplicity, only BM0 is shown in FIG. 4. However, on the backside of the substrate 401, a plural number of metallization layers can be formed (referred to as e.g., BM0, BM1, BM2 and BM3), each of which includes one or more metal tracks or lines embedded in a corresponding dielectric material (e.g., inter-metal dielectric (IMD) or inter-layer dielectric (ILD)).

As shown in FIG. 4, in some embodiments, the first reading transistor 124 and the second reading transistor 126 are formed along the primary or major surface of the frontside 403 of the substrate 401, and the first programming transistor 120 and the second programming transistor 122 are formed in a metallization layer (e.g., M2) that is disposed over the first reading transistor 124 and the second reading transistor 126 in the BEOL network. As shown, the first programming transistor 120 and the second programming transistor 122 formed in the BEOL network are vertically farther away from the major surface of the frontside 403 than the first reading transistor 124 and the second reading transistor 126 formed in the FEOL network. In this way, the area and the programming voltage for each anti-fuse memory cell of the memory device can be reduced, thereby leading to higher density of the memory cells in the memory device and improved performance of the memory device.

Figure 5:
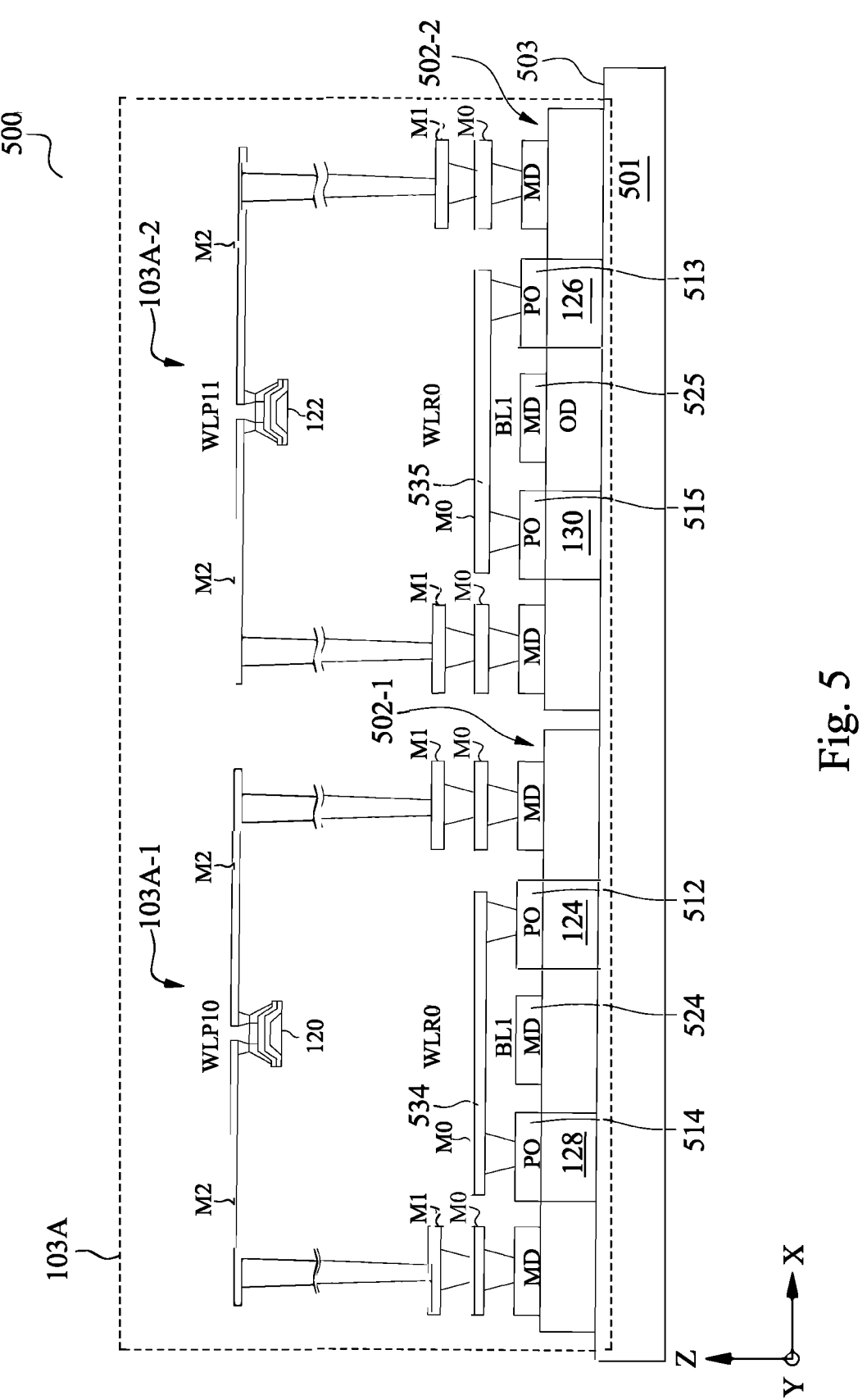
FIG. 5 illustrates a cross-sectional view of a memory device including a memory cell of FIG. 2C in accordance with some embodiments.

FIG. 5 illustrates a cross-sectional view of a memory device 500 including at least a memory cell 103A as shown in FIG. 2C in accordance with some embodiments. In some embodiments, the memory cell 103A of the memory device 500 is implemented as an anti-fuse memory cell according to the circuit diagram 200C of FIG. 2C (the "6T" configuration), and thus some references of FIG. 2C will be reused. The memory cell 103A in FIG. 5 is used as a representative example, however, the structure and configuration of each of the memory cells 103 in FIG. 1A can be the same as or similar to the memory cell 103A as shown in FIG. 5.

Referring to FIGS. 2C and 5, the memory cell 103A includes a first programming transistor 120 coupled in series between a first reading transistor 124 and a third reading transistor 128, and a second programming transistor 122 coupled in series between a second reading transistor 126 and a fourth reading transistor 130. As shown in FIG. 5, the anti-fuse memory cell 103A is formed on a frontside 503 of a substrate 501 and includes a first portion 103A-1 formed on a first active region 502-1 and a second portion 103A-2 formed on a second active region 502-2. The first portion 103A-1 of the memory cell 103A includes the first programming transistor 120 coupled in series between the first reading transistor 124 and the third reading transistor 128, and the second portion 103A-2 of the memory cell 103A includes the second programming transistor 122 coupled in series between the second reading transistor 126 and the fourth reading transistor 130. At least some parts of the first portion 103A-1 and the second active region 502-2 are connected as discussed below.

Referring to FIG. 5, in some embodiments, all the reading transistors (such as 124, 126, 128 and 130) are commonly gated by a reading word line WLR0 through at least some gate structures (such as 512, 514, 513 and 515) and some metal tracks (such as M0 metal tracks 534 and 535). For example, M0 metal tracks 534 and 535 are coupled to each other (not shown). In some embodiments, the first reading transistor 124 and the third reading transistor 128 are commonly coupled to a bit line $BL_1$ through MD 524, and the second reading transistor 126 and the fourth reading transistor 130 are commonly coupled to the same bit line $BL_1$ through MD 525. For example, MD 524 and MD 525 are coupled to each other (not shown). The first programming transistor 120 is gated by $WLP_{10}$, and the second programming transistor 122 is gated by $WLP_{11}$.

As shown in FIG. 5, in some embodiments, all the reading transistors (such as 124, 126, 128 and 130) are formed along the major surface of the frontside 503 of the substrate 501 in the FEOL network, and the first and the second programming transistors 120 and 122 are formed in a metallization layer (e.g., M2) disposed over all the reading transistors in the BEOL network. As shown, the first and the second programming transistors 120 and 122 formed in the BEOL network are vertically farther away from the major surface of the frontside 503 than all the reading transistors formed in the FEOL network. In this way, the area and the programming voltage for each memory cell can be reduced, thereby leading to relatively high density of the memory cells in the memory device and improved performance of the memory device.

Figure 6A:
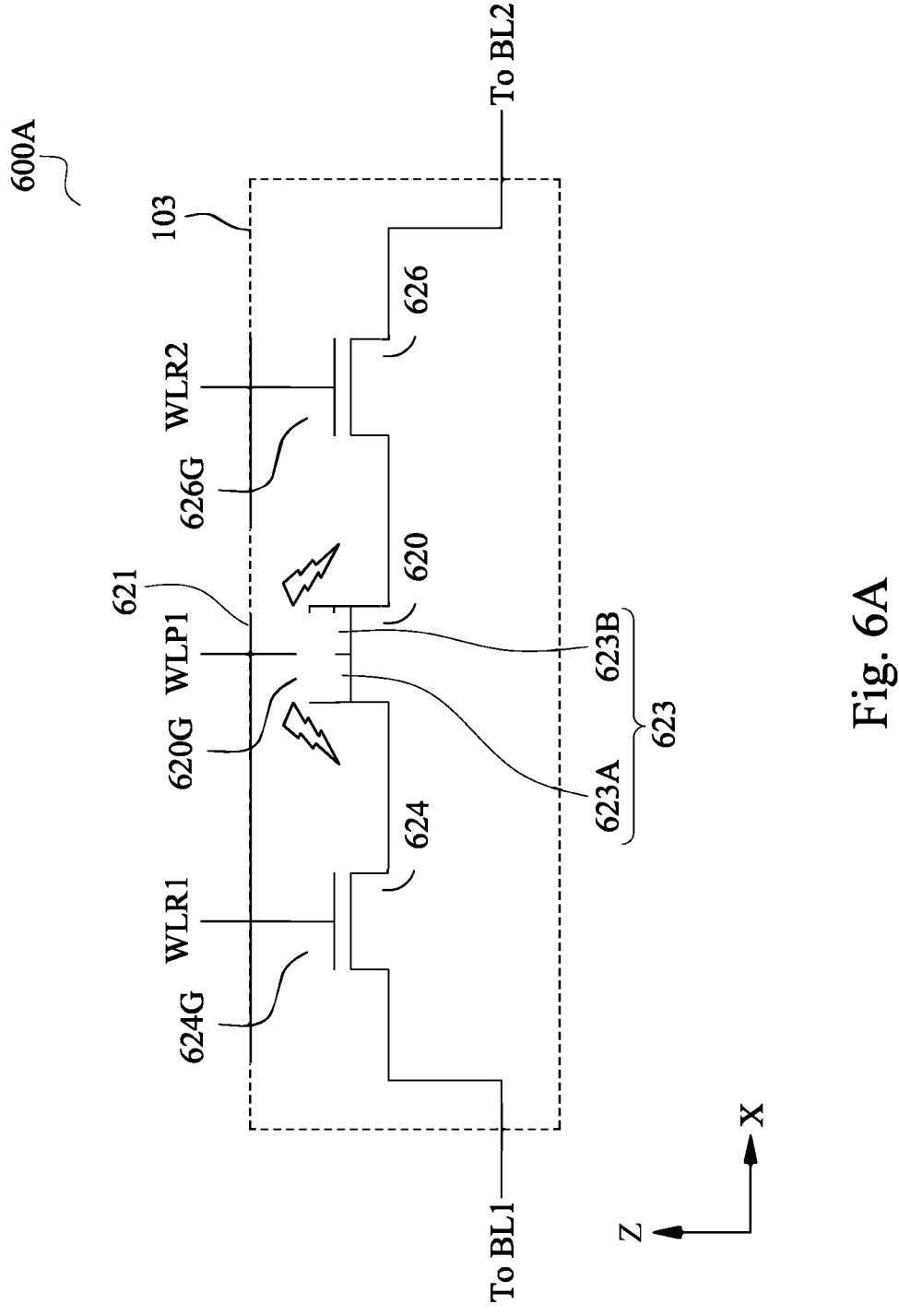
FIGS. 6A, 6B and 6C illustrate various example circuit diagrams of a memory cell of the memory array of FIG. 1A in accordance with other embodiments.
Figure 6B:
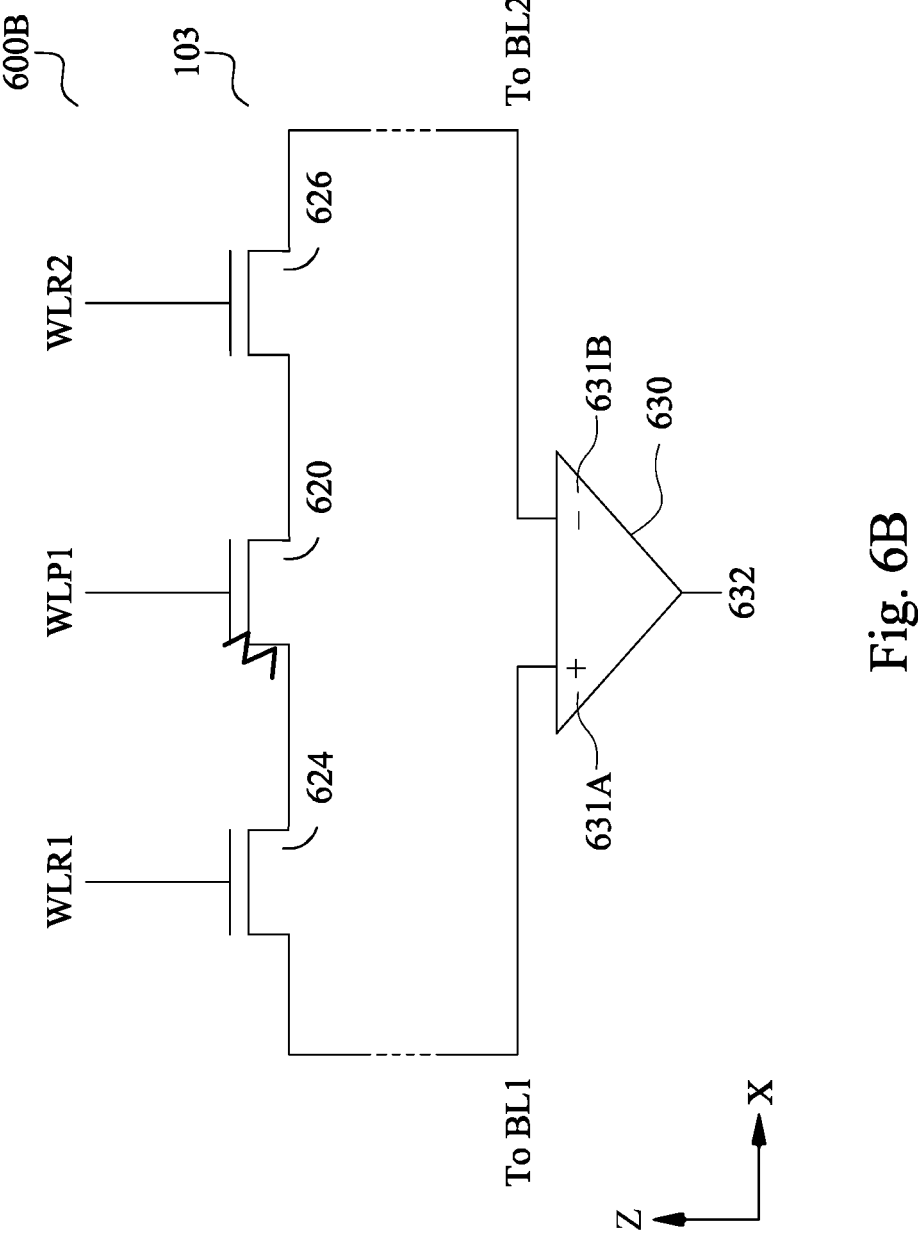
Figure 6C:
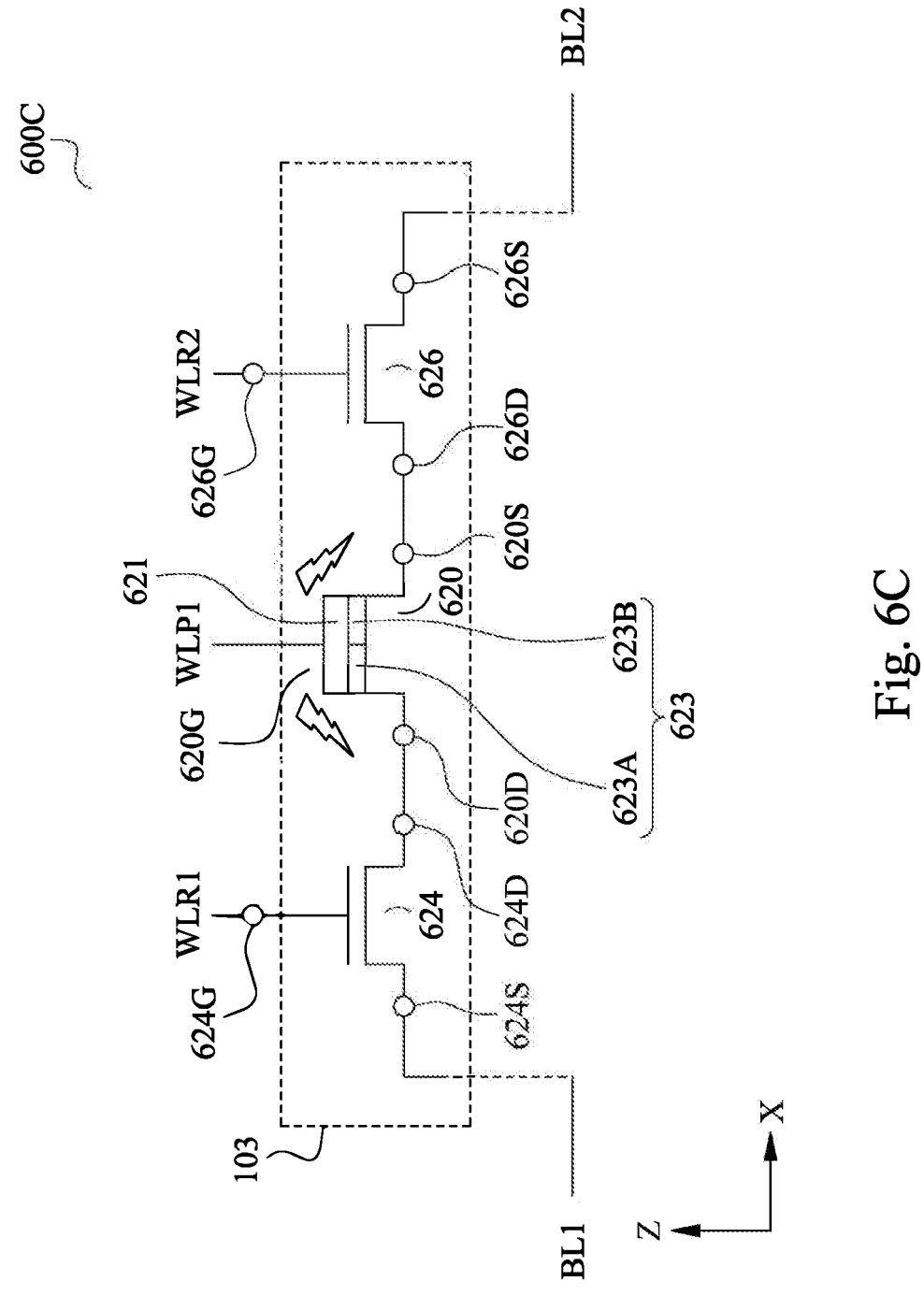

FIGS. 6A, 6B and 6C illustrate example circuit diagrams of a memory cell 103 of the memory array 102 of FIG. 1A in accordance with other embodiments. In some embodiments, each memory cell 103 is embodied as an anti-fuse memory cell. As shown in FIG. 6A, in some embodiments, an anti-fuse memory cell 103 includes a programming transistor 620 gated by $WLP_1$, a first reading transistor 624 gated by WLR1, and a second reading transistor 626 gated by WLR2. The programming transistor 620 is coupled between the first reading transistor 624 and the second reading transistor 626 in series. A source/drain (S/D) terminal of the first reading transistor 624 is coupled to a first bit line $BL_1$, and a source/drain (S/D) terminal of the second reading transistor 626 is coupled to a second bit line $BL_2$.

In some embodiments, the programming transistor 620 includes a gate terminal 620G including a gate metal 621, and a gate dielectric layer 623 that is made of a dielectric material and deposited under the gate metal 621. In some embodiments, the dielectric material of the gate dielectric layer 623 is selected from $HfO_2$, HfSiO, HfSiON, HfTaO, HfTiO, HfZrO, zirconium oxide, aluminum oxide, titanium oxide, and/or combinations thereof. The gate dielectric layer 623 includes a first dielectric portion 623A and a second dielectric portion 623B that have the same dimension and can be concurrently or separately turned on/off to enable/disable an access for programing or reading to the programming transistor 620.

In a programming process, to enable programming of the programming transistor 620, a program-enabling voltage (e.g., 1.2V) can be concurrently or separately applied to gates 624G and 626G of the first and the second reading transistors 624 and 626. Upon being enabled, the programming transistor 620 can be programmed by applying a programming voltage (e.g., 5V) to its gate 620G and applying a low bit line voltage (e.g., 0V) to the bit lines $BL_1$ and $BL_2$.

In the programming process, randomly, one of the first and the second dielectric portions 623A and 623B of the gate dielectric layer 623 of the programming transistor 620 of the selected memory cell 103 can be broken down faster than the other one, even though the possibility for any one of them is 50%. After one (e.g., 623A) of the first and the second dielectric portions has been broken down first, the programming process stops, and thus the other one (e.g., 623B) remains intact. Consequently, a logic state or bit (e.g., 1) of logic states (1 or 0) of the memory cell 103 can be randomly generated based on whether the first dielectric portion 623A or the second dielectric portion 623B of its gate dielectric layer 623 has been broken down, and thus a bit of the PUF signature for the anti-fuse memory cell 103 is generated. Such a mechanism of randomly generating the bit of the PUF signature for the anti-fuse memory cell 103 in FIG. 6A applies to all of the memory cells 103 in FIG. 1A. In this way, the PUF signature of the memory device including the memory cells can be generated.

In a reading process, the memory cell 103 is selected and thus read by applying a reading selection voltage (e.g., 1.5V) to the gate 620G of its programming transistor 620, applying a reading selection voltage (e.g., 0.75V) to the gates 624G and 626G of its first and second reading transistors 624 and 626, and applying a low BL voltage (e.g., 0V) to corresponding source/drain terminals of its first and second reading transistors 624 and 626 through bit lines $BL_1$ and $BL_2$.

FIG. 6B illustrates an example circuit diagram 600B of the anti-fuse memory cell 103 as shown in FIG. 6A that is connected to a differential amplifier 630 according to some embodiments. The differential amplifier 630 has a first and a second input terminals 631A and 631B respectively coupled to bit lines $BL_1$ and $BL_2$, and an output terminal 632 to output a state result (e.g., 1 or 0) of the memory cell 103. The result represents whether the first dielectric portion 623A or the second dielectric portion 623B of the gate dielectric layer 623 has been broken down based on an appreciable current detected in the first input terminal 631A or the second input terminal 631B, thereby determining a logic state of the memory cell 103.

In the reading process, upon detecting an appreciable current in the first input terminal 631A, the first dielectric portion 623A is determined to have been broken down, and thus the memory cell 103 is determined to be in a first logic state "1". Otherwise, upon detecting an appreciable current in the second input terminal 631B, the second dielectric portion 623B is determined to have been broken down, and thus the memory cell 103 is determined to be in second logic state "0." Such a mechanism of reading a logic state of the memory cell 103 in FIG. 6B applies to all of the memory cells 103 in FIG. 1A. In this way, a PUF signature of the memory device is read and thus authenticated.

FIG. 6C illustrates an example circuit diagram 600C of a memory device including an anti-fuse memory cell 103 in accordance with some embodiments. As shown, the anti-fuse memory cell 103 is configured substantially similar to the anti-fuse memory cell 103 in FIG. 6A. Referring to FIG. 6C, the anti-fuse memory cell 103 is implemented as a "3T" symmetric configuration, and includes a programming transistor 620, a first reading transistor 624, and a second reading transistor 626. The programming transistor 620 is coupled between the first and the second reading transistors 624 and 626 in series. In some embodiments, the memory device also includes $BL_1$ and $BL_2$ respectively coupled to the first and the second reading transistors 624 and 626.

As shown in FIG. 6C, a source/drain terminal 620D of the programming transistor 620 is coupled to a source/drain terminal 624D of the first reading transistors 624, and the other source/drain terminal 620S of the programming transistor 620 is coupled to a source/drain terminal 626D of the second reading transistor 626. The programming transistor 620 is gated by $WLP_1$ via its gate terminal 620G, the first reading transistor 624 is gated by WLR1 via its gate terminal 624G, and the second reading transistor 626 is gated by WLR2 via its gate terminal 626G. In some embodiments, a source/drain terminal 624S of the first reading transistor 624 is operatively coupled to $BL_1$, and a source/drain terminal 626S of the second reading transistors 626 is operatively coupled to $BL_2$.

Also as shown in FIG. 6C, the gate terminal 620G includes a gate metal 621, and a gate dielectric layer 623 that has a first dielectric portion 623A and a second dielectric portion 623B. The first dielectric portion 623A is coupled between the gate metal 621 and the source/drain terminal 620D of the programming transistor 620, and the second dielectric portion 623B is coupled between the gate metal 621 and the other source/drain terminal 620S of the programming transistor 620. As mentioned above, the memory cell 103 randomly presents a logic state of either a first logic state (e.g., 1) or a second logic state (e.g., 0) based on which of the first dielectric portion 623A or the second dielectric portion 623B of a gate dielectric layer 623 is determined to have been broken down. The ways of generating and reading a bit of PUF signature for/from the anti-fuse memory cell 103 in FIG. 6B also apply to the anti-fuse memory cell 103 in FIG. 6C.

Figure 7A:
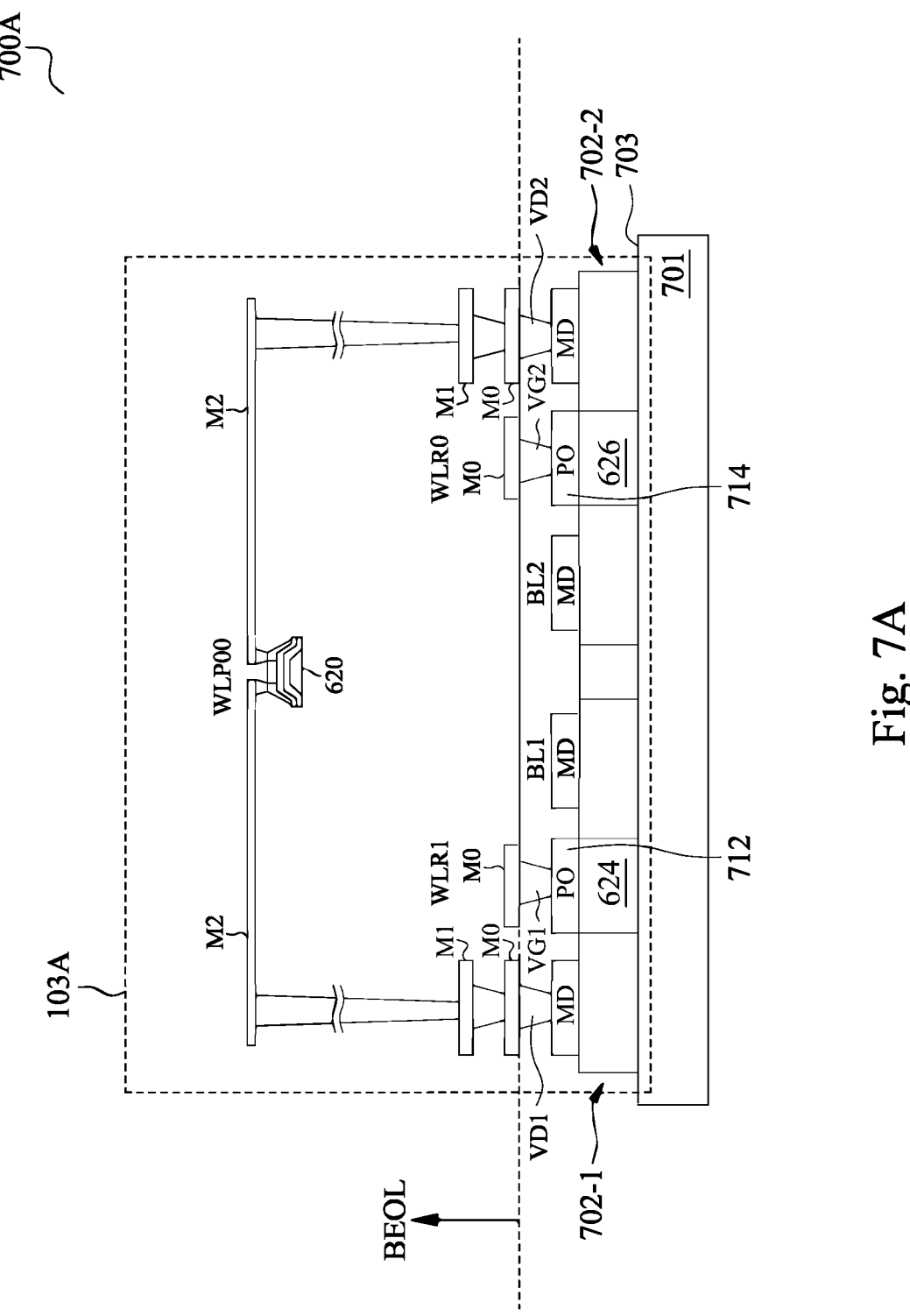
FIGS. 7A, 7B and 7C illustrate various cross-sectional views of the memory devices formed based on circuit diagrams of FIG. 6A in accordance with some embodiments.

FIG. 7A illustrates a cross-sectional view of a memory device 700A designed based on the circuit diagram 600A in FIG. 6A. In some embodiments, the memory cell 103A in FIG. 7A is implemented as an anti-fuse memory cell designed in a "3T RPR" configuration as shown in FIG. 6A, and thus some references of FIG. 6A will be reused. The memory cell 103A is used as a representative example.

As shown in FIG. 7A, the memory device 700A includes an anti-fuse memory cell 103A, randomly presenting a first logic state or a second logic state, and being formed on a major surface of a frontside 703 of a substrate 701. The memory cell 103A at least includes a programming transistor 620, a first reading transistor 624, and a second reading transistor 626. The programming transistor 620 is coupled between the first and the second reading transistor 624 and

626 in series. The memory device 700A also includes $BL_1$ and $BL_2$ respectively coupled to the first and the second reading transistors 624 and 626. The programming transistor 620 is gated by $WLP_{00}$.

In some embodiments, the first and the second reading transistors 624 and 626 are formed along a major surface of the frontside 703 of a substrate 701 in a FEOL, while the programming transistor 620 is formed in a metallization layer (e.g., M2) of a plurality of metallization layers (e.g., M0, M1 and M2) disposed in a BEOL network over the first and the second reading transistors 624 and 626. As shown, the programming transistor 620 formed in the BEOL network is vertically farther away from the frontside 703 of the substrate 701 than the first and the second reading transistors 624 and 626 formed in the FEOL network. In this way, the area and the programming voltage for each anti-fuse memory cell can be reduced, thereby leading to higher density of the memory cells in the memory device and improved performance of the memory device.

Figure 8A:
FIG. 8A illustrates a 2D access transistor in accordance with some embodiments.
Figure 8A:
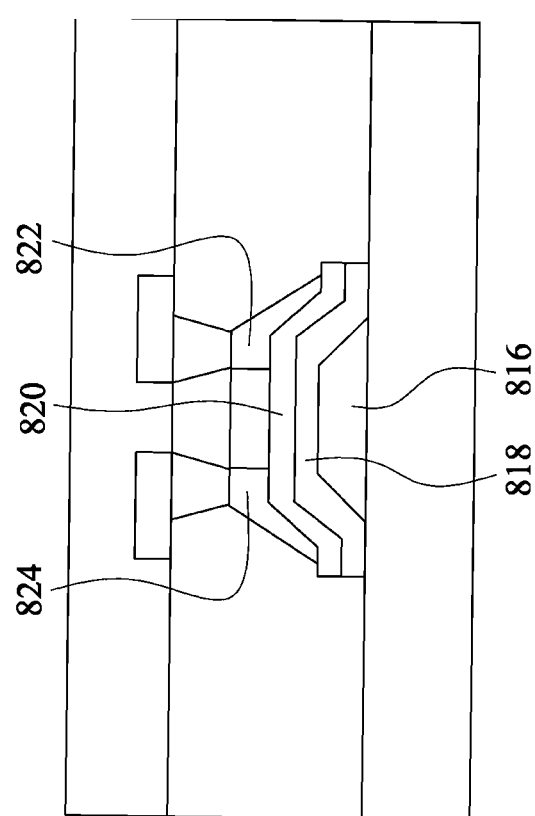
Figure 8A:
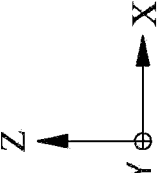
Figure 8B:
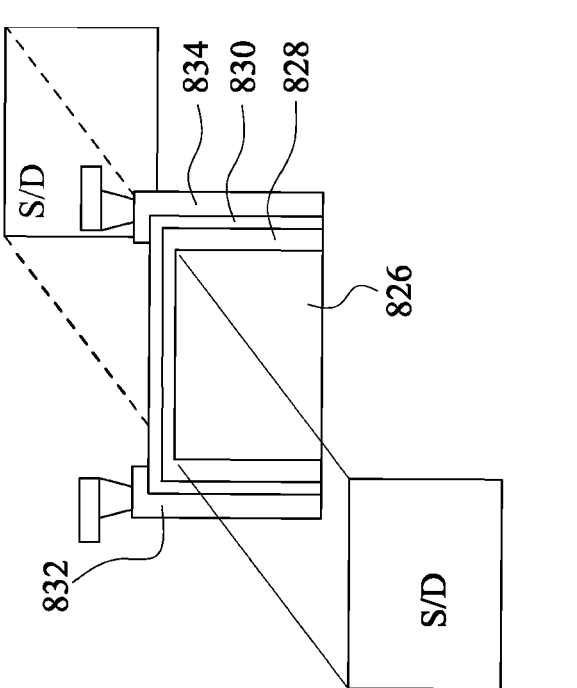
FIG. 8B illustrates a 3D access transistor in accordance with some embodiments.

In some embodiments, the first reading transistor 624 is gated by a reading word line WLR1 through a first gate structure 712, and the second reading transistor 626 is gated by a second reading word line WLR0 through a second gate structure 714. In some embodiments, the first reading transistor 624 is formed in a first active region 702-1 disposed along the major surface of the frontside 703 of the substrate 701, and the second reading transistor 626 is formed in a second active region 702-2 disposed along the major surface of the frontside 703 of the substrate 701. In some embodiments, the first active region 702-1 and the second active region 702-2 are separated from each other by a dielectric structure. In some embodiments, the programming transistor 620 includes a thin-film (or 2D) transistor as shown in FIGS. 8A and 8B, which can be programmed by a relatively low programming voltage.

Figure 7B:
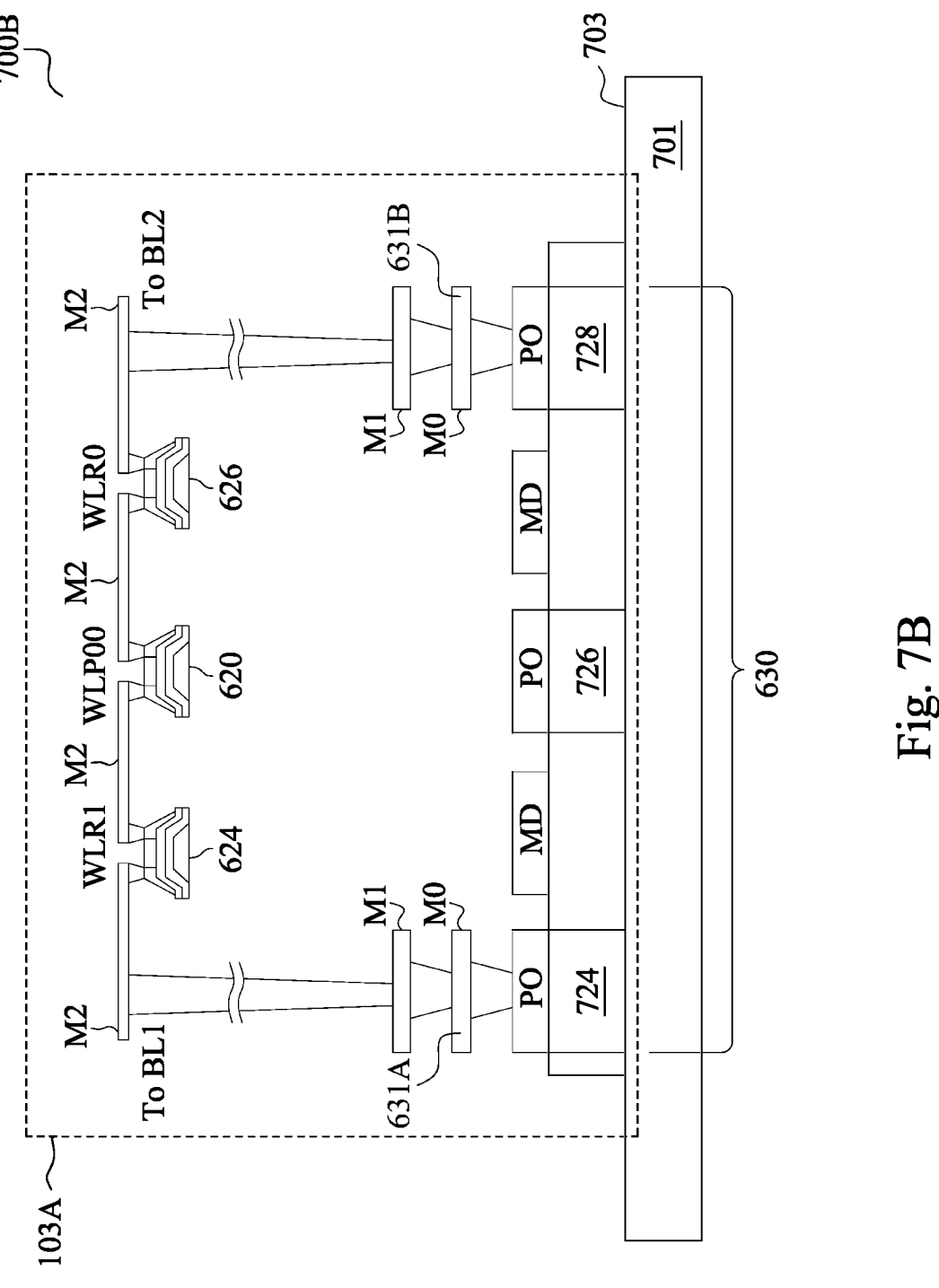

FIG. 7B illustrates a cross-sectional view 700B of an anti-fuse memory cell 103A designed based on the circuit diagram 600B in FIG. 6B, and thus some references in FIG. 6B will be reused. In some embodiments, the memory cell 103A in FIG. 7B is implemented as an anti-fuse memory cell designed in a "3T RPR" configuration and includes a differential amplifier 630 as shown in FIG. 6B. The memory cell 103A as shown in FIG. 7B is similar to the memory cell 103A as shown in FIG. 7A but have some differences.

In some embodiments, as shown in FIG. 7B, the programming transistor 620 is coupled in series between the first reading transistor 624 and the second reading transistor 626, and all the programming transistor 620, the first reading transistor 624, and the second reading transistor 626 are formed in a metallization layer (e.g., M2) of a plurality of metallization layers (e.g., M0, M1, M2) disposed in a BEOL network over the major surface of the frontside 703 of the substrate 701. In some embodiments, all the programming transistor 620, the first reading transistor 624, and the second reading transistor 626 are 2D transistors as shown in FIGS. 8A and 8B, which can be programmed by a relatively low programming voltage.

In some embodiments, as shown, some peripheral components such as transistors 724, 726 and 728 are formed along the major surface of the frontside 703 of the substrate 701. In some embodiments, some of the transistors 724, 726 and 728 function as the differential amplifier 630 that has a first and a second input terminals 631A and 631B respectively coupled to $BL_1$ and $BL_2$. Referring to FIGS. 6A and 6B, the result output from the differential amplifier 630 represents whether the first dielectric portion 623A or the second dielectric portion 623B of the gate dielectric layer

623 has been broken down based on an appreciable current detected in the first input terminal 631A or the second input terminal 631B, thereby determining a logic state of the memory cell 103A.

Figure 7C:
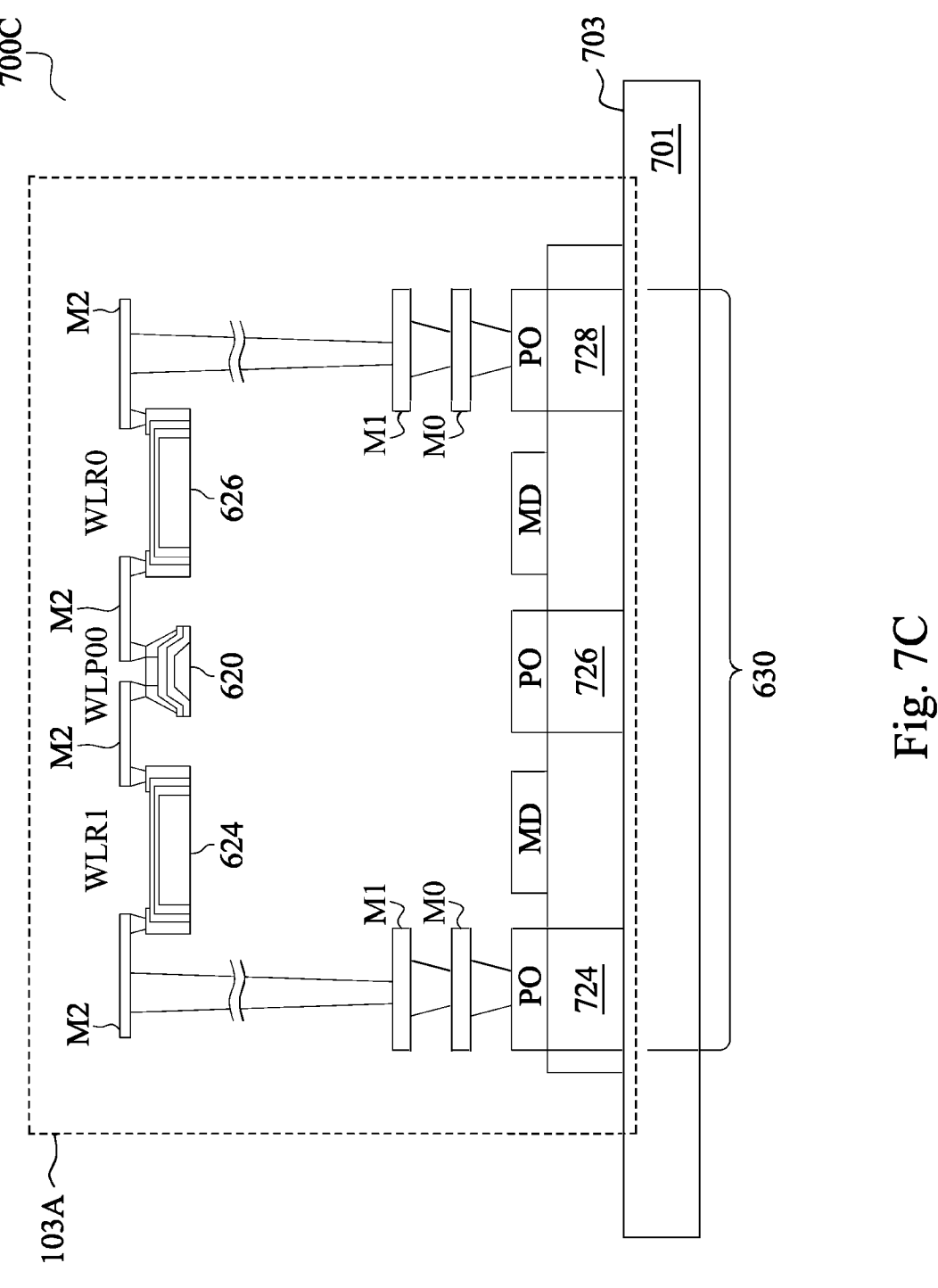

FIG. 7C illustrates a cross-sectional view 700C of an anti-fuse memory cell 103A designed based on the circuit diagram 600B in FIG. 6B, and thus some references of FIG. 6B will be reused. The memory cell 103A in FIG. 7C is substantially similar to the memory cell 103A in FIG. 7B but has some differences. As shown in FIG. 7C, all the programming transistor 620, the first reading transistor 624, and the second reading transistor 626 are formed in a metallization layer (e.g., M2) of a plurality of metallization layers (e.g., M0, M1, M2) disposed in a BEOL network over the major surface of the frontside 703 of the substrate 701. The programming transistor 620 is a 2D access transistor as shown in FIGS. 8A and 8B, which can be programmed by a relatively low programming voltage, while the first reading transistor 624 and the second reading transistor 626 are 3D access transistors as shown in FIG. 9, each of which can bear or stand relatively large current and thus obtains relatively fast reading speed.

FIG. 8A illustrates an access transistor 800A in accordance with some embodiments. As shown, the access transistor 800A is a thin film transistor including a bottom gate 816, a gate dielectric 818 disposed over the bottom gate 816, a channel structure 820 disposed over the gate dielectric 818, and a pair of source/drain structures 822 and 824 disposed over the channel structure 820. The thin film transistor 800A in FIG. 8A can be referred to as a "two-dimensional back-gate transistor" or "2D transistor." The term "two-dimensional back-gate transistor" may refer to a transistor having its gate formed as a relatively planar or thinner structure and its channel structure contacting a top surface of its gate. In some embodiments, the bottom gate 816 includes TiN, the gate dielectric 818 includes a high-K dielectric material (such as $HfO_2$), the channel structure 820 includes InGaZnO (IGZO), and the source/drain structures 822 and 824 includes TiN. The 2D transistor 800A as shown in FIG. 8A can be implemented as any one of a programming transistor 620, a first reading transistor 624, and a second reading transistor 626 as shown in FIGS. 7A-7C. In some embodiments, the 2D transistor 800A as shown in FIG. 8A is implemented as a programming transistor 620. Due to its structure (such as thinner gate oxide), a 2D programming transistor 620 is relatively easy to be broken down (or programmed), thereby obtaining relatively fast programming speed and relatively low programming voltage.

FIG. 8B illustrates another access transistor 800B in accordance with other embodiments. As shown, the access transistor 800B includes a bottom gate 826, a gate dielectric 828 disposed over the bottom gate 826, a channel structure 830 disposed over the bottom gate dielectric 826, and a pair of source/drain structures 832 and 834 disposed over the channel structure 830. The access transistor 800B in FIG. 8B can be referred to as a "three-dimensional back-gate transistor" or "3D transistor." The term "three-dimensional back-gate transistor" may refer to a transistor having its gate formed as a relatively protruding structure and its channel structure contacting multiple surfaces of its gate. In some embodiments, the bottom gate 826 includes TiN, the gate dielectric 828 includes a high-K dielectric material (such as $HfO_2$), the channel structure 830 includes InGaZnO (IGZO), and the source/drain structures 832 and 834 includes TiN. In some embodiments, the 3D transistor 800B can be implemented as any one of the first and the second reading transistors 624 and 626 as shown in FIG. 7C. Due to their structures, 3D reading transistors 624 and 626 can stand or bear relatively large reading current passing therethrough and obtain relatively fast reading speed.

FIG. 9 illustrates a flow chart of a method 900 to fabricate the memory device 400 as shown in FIG. 4 in accordance with some embodiments, and thus some references used above in FIG. 4 will be reused in the following discussion of the method 900. It is noted that the method 900 is merely an example and is not intended to limit the present disclosure. Accordingly, it is understood that additional operations may be provided before, during, and after the method 900, and that some other operations may only be briefly described herein. The order of the operations may be interchangeable.

As discussed above, the memory device 400 at least includes a memory cell 103A that is designed in 4T configuration and formed on a frontside 403 of a substrate 401, and a plurality of metallization layers (such as M0, M1, M2 . . . ) respectively disposed over the frontside 403 of the substrate 401. In some embodiments, the memory cell 103A includes a first reading transistor 124 and a second reading transistor 126 both formed along a major surface of the frontside 403 of the substrate 401 in the FEOL network, and a first programming transistor 120 and a second programming transistor 122 both formed in a first one (e.g., M2) of the plurality of metallization layers in the BEOL network that is over the first reading transistor 124 and the second reading transistor 126.

The method 900 starts with operation 902 in which a substrate is provided, in accordance with various embodiments. The substrate includes a semiconductor material substrate, for example, silicon. Alternatively, the substrate may include other elementary semiconductor material such as, for example, germanium. The substrate may also include a compound semiconductor such as silicon carbide, gallium arsenic, indium arsenide, and indium phosphide. The substrate may include an alloy semiconductor such as silicon germanium, silicon germanium carbide, gallium arsenic phosphide, and gallium indium phosphide. In one embodiment, the substrate includes an epitaxial layer. For example, the substrate may have an epitaxial layer overlying a bulk semiconductor. Furthermore, the substrate may include a semiconductor-on-insulator (SOI) structure. For example, the substrate may include a buried oxide (BOX) layer formed by a process such as separation by implanted oxygen (SIMOX) or other suitable technique, such as wafer bonding and grinding.

The method 900 continues to operation 904 in which a stack, including an alternating series of first nanostructures and second nanostructures, is formed in accordance with various embodiments. Such a stack can be formed based on one of the (active region) patterns discussed above. The stack can be formed in a frontside of the substrate. In some embodiments, the first nanostructures may include SiGe sacrificial nanostructures, and the second nanostructures may include Si channel nanostructures. Such a stack may be referred to as a superlattice. In a non-limiting example, the SiGe sacrificial nanostructures can be SiGe 25%. The notation "SiGe 25%" is used to indicate that 25% of the SiGe material is Ge. It is understood the percentage of Ge in each of the SiGe sacrificial nanostructures can be any value between 0 and 100 (excluding 0 and 100), while remaining within the scope of present disclosure. In some other embodiments, the second nanostructures may include a first semiconductor material other than Si and the first nanostructures may include a second semiconductor material other than SiGe, as long as the first and second semiconductor materials are respectively characterized with different etching properties (e.g., etching rates).

The alternating series of nanostructures can be formed by epitaxially growing one layer and then the next until the desired number and desired thicknesses of the nanostructures are achieved. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The method 900 continues to operation 906 in which a number of dummy gate structures are formed in accordance with various embodiments. Such a dummy gate structure can be formed based on one of the (gate structure) patterns discussed above. The dummy gate structure can extend along a direction perpendicular to the lengthwise direction of a dielectric fin structure (and the stack). Further, the dummy gate structure may be formed shorter than the dielectric fin structure in one of various embodiments, and thus, the dummy gate structure, as formed, is cut (or otherwise separated) by the dielectric fin structure.

The dummy gate structure can be formed by depositing amorphous silicon (a-Si) over the stack. Other materials suitable for forming dummy gates (e.g., polysilicon) can be used while remaining within the scope of present disclosure. The a-Si is then planarized to a desired level. A hard mask is deposited over the planarized a-Si and patterned. The hard mask can be formed from a nitride or an oxide layer. An etching process (e.g., a reactive-ion etching (RIE) process) is applied to the a-Si to form the dummy gate structure. After forming the dummy gate structure, gate spacers may be formed to extend along sidewalls of the dummy gate structure. The gate spacers can be formed by a conformal deposition of a dielectric material (e.g., silicon oxide, silicon nitride, silicon oxynitride, SiBCN, SiOCN, SiOC, or any suitable combination of those materials) followed by a directional etch (e.g., RIE).

The method 900 proceeds to operation 908 in which inner spacers are formed by replacing end portions of each of the SiGe sacrificial nanostructures with a dielectric material, in accordance with various embodiments. Upon forming the dummy gate structure overlaying certain portions of the stack (e.g., the portions of the stack separated by the dielectric fin structure), the non-overlaid portions of the stack are removed. Next, respective end portions of each SiGe sacrificial nanostructure of the overlaid stack are removed. The inner spacers are formed by filling such recesses of each SiGe sacrificial nanostructure with a dielectric material by chemical vapor deposition (CVD), or by monolayer doping (MLD) of nitride followed by spacer RIE. A material of the inner spacers can be formed from the same or different material as the gate spacers described above. For example, the inner spacers can be formed of silicon nitride, silicoboron carbonitride, silicon carbonitride, silicon carbon oxynitride, or any other type of dielectric material (e.g., a dielectric material having a dielectric constant k of less than about 5).

The method 900 proceeds to operation 910 in which a number of epitaxial structures are formed, in accordance with various embodiments. Upon forming the inner spacers, the epitaxial structures are formed using an epitaxial layer growth process on exposed ends of the Si nanostructures. In-situ doping (ISD) may be applied to form doped epitaxial structures, thereby creating the necessary junctions for a corresponding transistor (or sub-transistor). N-type and p-type FETs are formed by implanting different types of dopants to selected regions of the device to form the necessary junction(s). N-type devices can be formed by implanting arsenic (As) or phosphorous (P), and p-type devices can be formed by implanting boron (B). After forming the epitaxial structures, an inter-layer dielectric (e.g., silicon dioxide) is deposited to overlay the epitaxial structures.

The method 900 proceeds to operation 912 in which the dummy gate structures and the remaining SiGe sacrificial nanostructures are replaced with respective active gate structures in accordance with various embodiments. Subsequently to forming the inter-layer dielectric, the dummy gate structures are removed by an etching process, e.g., RIE or chemical oxide removal (COR). Next, the remaining SiGe sacrificial nanostructures are removed while keeping the Si channel nanostructure substantially intact by applying a selective etch (e.g., a hydrochloric acid (HCl)). After the removal of the SiGe sacrificial nanostructures, top and bottom surfaces, and sidewalls of each of the Si channel nanostructures can be exposed, except for the sidewall in contact with the dielectric fin structure. Next, a number of active gate structures can be formed to wrap around each of the Si channel nanostructures, except for the sidewall contacting the dielectric fin structure. Each of the active gate structures includes at least a gate dielectric layer (e.g., a high-k dielectric layer) and a gate metal layer (e.g., a work function metal layer). Upon the active gate structures being formed, one or more transistors of the memory device can be formed. Referring to e.g., FIG. 4, a first and a second reading transistors 124 and 126 of the memory device 400 are formed along a major surface of the frontside 403 of the substrate 401 in the FEOL network.

The method 900 proceeds to operation 914 in which a number of frontside interconnect structures are formed in accordance with various embodiments. Upon forming the reading transistors (e.g., 124 and 126), a number of middle-end interconnect structures (e.g., VGs and MDs) are formed over the reading transistors. For example, referring to FIG. 4, a number of VGs (e.g., VG1 and VG2) can be formed to couple to gate terminals of the reading transistors 124 and 126 respectively, and a number of MDs (e.g., 422, 424 and 426) can be formed to couple to source/drain terminals of the reading transistors 124 and 126 respectively. Further, a number of back-end interconnect structures can be formed over the middle-end interconnect structures. The back-end interconnect structures include, for example, M0 metal tracks (e.g., 432, 434 and 436) in M0 layer, M1 metal tracks (e.g., 442 and 444) in M1 layer, and M2 metal tracks (e.g., 452, 454 and 456) in M2 layer, and other metal tracks in upper metallization layers (not shown). Through at least the VGs, each of the reading transistors 124 and 126 can be gated. In some embodiments, as shown in FIG. 4, the reading transistors 124 and 126 are commonly gated by a reading word line WLR1 through a metal track 434, and are commonly coupled to a bit line $BL_1$ through MD 424.

The frontside interconnect structure can be formed of a metal material. The metal material can be selected from the group consisting of aluminum, tungsten, tungsten nitride, copper, cobalt, silver, gold, chrome, ruthenium, platinum, titanium, titanium nitride, tantalum, tantalum nitride, nickel, hafnium, and combinations thereof. Other metal materials are within the scope of the present disclosure. The frontside interconnect structures can be formed by overlaying the frontside of the substrate with the above-listed metal material by, for example, chemical vapor deposition (CVD), physical vapor deposition (PVD), electroless plating, electroplating, or combinations thereof.

The method 900 proceeds to operation 916 in which a first programming transistor and a second programming transistor are formed in a first one of the plurality of metallization layers in the BEOL network over the first reading transistor and the second reading transistor. Similarly, at least some of the above-mentioned processes used to form the reading transistors can be used to form the programming transistors. Referring to FIG. 4, in the memory device 400, the first programming transistor 120 and the second programming transistor 122 are formed in a metallization layer M2 in the BEOL network over the first reading transistor 124 and the second reading transistor 126 that are formed along a major surface of the frontside 403 of the substrate 401 in the FEOL network. Through the frontside interconnect structures, the first and the second programming transistors 120 and 122 are respectively gated to $WLP_{10}$ and $WLP_{11}$. And through the frontside interconnect structures, the first and the second reading transistors 124 and 126 are respectively connected to the first and the second programming transistors 120 and 122 in series. In some embodiments, a source/drain terminal of the first programming transistor 120 and a source/drain terminal of the second programming transistor 122 are commonly connected and are floating.

The method 900 proceeds to operation 918 in which a number of backside interconnect structures are formed in accordance with various embodiments. Upon forming the back-end metal tracks, the substrate is flipped, and a number of backside interconnect structures (e.g., BM0, BM1, BM3 tracks) are formed over the backside of the substrate. For example, after the substrate is flipped, a polishing process may be performed on the backside of the substrate until a bottom surface of the epitaxial structures (e.g., the source/drain terminals formed in operation 910) is exposed. Next, one or more dielectric layers are formed over the polished backside surface, followed by forming the backside via structures that can each extend through the one or more dielectric layers to reach the bottom surface of a corresponding epitaxial structure. Next, the backside interconnect structures can be formed in respective backside metallization layers.

The backside interconnect structure is formed of a metal material. The metal material can be selected from the group consisting of aluminum, tungsten, tungsten nitride, copper, cobalt, silver, gold, chrome, ruthenium, platinum, titanium, titanium nitride, tantalum, tantalum nitride, nickel, hafnium, and combinations thereof. Other metal materials are within the scope of the present disclosure. The backside interconnect structures can be formed by overlaying the backside of the substrate with the above-listed metal material by, for example, chemical vapor deposition (CVD), physical vapor deposition (PVD), electroless plating, electroplating, or combinations thereof.

In one aspect of the present disclosure, a memory device is disclosed. The memory device includes an anti-fuse memory cell that randomly presents either a first logic state or a second logic state. The memory cell is formed on a frontside of a substrate and at least includes a first programming transistor that is formed in a first one of a plurality of metallization layers disposed over the frontside and gated by a first programming word line; and a first reading transistor that is formed in a second one of the plurality of metallization layers disposed over the frontside or along a major surface on the frontside, coupled to the first programming transistor and a first bit line in series, and gated by a first reading word line.

In another aspect of the present disclosure, a memory system is disclosed. The memory system includes a memory array including a plurality of anti-fuse memory cells formed on a frontside of a substrate, and an authentication circuit operatively coupled to the memory array and configured to generate a bit of a Physically Unclonable Function (PUF) signature for each of the plurality of memory cells based on the logic state thereof. Each of the memory cells presents a logic state of either a first logic state or a second logic state. Each of the memory cells at least includes a first programming transistor formed in a first one of a plurality of metallization layers disposed over the frontside, and gated by a first programming word line; and a first reading transistor formed in a second one of the plurality of metallization layers disposed over the frontside or along a major surface on the frontside, coupled to the first programming transistor and a first bit line, and gated by a first reading word line.

In yet another aspect of the present disclosure, a method for fabricating a memory device is disclosed. The method includes forming a first reading transistor along a major surface on a frontside of a substrate; forming a first one of a plurality of metallization layers disposed over the first reading transistor to gate the first reading transistor to a first reading word line and to connect the first reading transistor to a first bit line; forming a second one of the plurality of metallization layers over the first one of the plurality of metallization layers; forming a first programming transistor in the second one of the plurality of metallization layers; and forming a third one of the plurality of metallization layers over the first one of the plurality of metallization layers to gate the first programming transistor to a first programming word line and to connect the first programming transistor to the first reading transistor.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
an anti-fuse memory cell configured to present either a first logic state or a second logic state, wherein the memory cell is formed on a frontside of a substrate and at least comprises:
a first programming transistor formed in a first one of a plurality of metallization layers disposed over an active surface of the frontside and gated by a first programming word line; and
a first reading transistor formed in a second one of the plurality of metallization layers disposed over an active surface of the frontside or along a major surface on the frontside, coupled to the first programming transistor and a first bit line in series, and gated by a first reading word line.

2. The memory device of claim 1, wherein the first reading transistor is formed along the major surface, the memory device further comprising:
a second programming transistor formed in the first one of the plurality of metallization layers and gated by a second programming word line; and
a second reading transistor formed along the major surface, coupled to the second programming transistor and the first bit line, and gated by a second reading word line.

3. The memory device of claim 2, wherein either a first gate dielectric layer of the first programming transistor or a second gate dielectric layer of the second programming transistor is configured to be randomly broken down to present the first logic state or the second logic state.

4. The memory device of claim 1, wherein the first bit line is formed in a third one of the plurality of metallization layers different from the first one and the second one of the plurality of metallization layers.

5. The memory device of claim 1, wherein the first reading transistor is formed in the second one of the plurality of metallization layers that is identical to the first one of the plurality of metallization layers, the memory device further comprising:
a second reading transistor formed in the second one of the plurality of metallization layers, coupled to a second bit line, and gated by a second reading word line.

6. The memory device of claim 5, wherein the first programming transistor is coupled between the first reading transistor and the second reading transistor in series.

7. The memory device of claim 6, wherein the first programming transistor comprises a gate metal and a gate dielectric layer under the gate metal, and wherein the gate dielectric layer comprises a first dielectric portion and a second dielectric portion.

8. The memory device of claim 7, wherein the first dielectric portion is coupled between the gate metal of the first programming transistor and the first reading transistor, and wherein the second dielectric portion is coupled between the gate metal of the first programming transistor and the second reading transistor.

9. The memory device of claim 8, wherein either the first dielectric portion or the second dielectric portion is configured to be randomly broken down, wherein the first dielectric portion is broken down to present the first logic state, and wherein the second dielectric portion is broken down to present the second logic state.

10. The memory device of claim 5, wherein the first and the second bit lines are formed in a third one of the plurality of metallization layers different from the first one and the second one of the plurality of metallization layers.

11. A memory system, comprising:
a memory array comprising a plurality of anti-fuse memory cells formed on a frontside of a substrate, each of the memory cells presenting a logic state of either a first logic state or a second logic state and at least comprising:
a first programming transistor formed in a first one of a plurality of metallization layers disposed over the frontside, and gated by a first programming word line; and
a first reading transistor formed in a second one of the plurality of metallization layers disposed over the frontside or along a major surface on the frontside, coupled to the first programming transistor and a first bit line, and gated by a first reading word line; and an authentication circuit operatively coupled to the memory array and configured to generate a bit of a Physically Unclonable Function (PUF) signature for each of the plurality of memory cells based on the logic state thereof.

12. The memory system of claim 11, wherein the first reading transistor is formed along the major surface, each of the memory cells further comprising:

a second programming transistor formed in the first one of the plurality of metallization layers, and gated by a second programming word line; and a second reading transistor formed along the major surface, coupled to the second programming transistor and the first bit line, and gated by a second reading word line.

13. The memory system of claim 12, wherein either a first gate dielectric layer of the first programming transistor or a second gate dielectric layer of the second programming transistor is configured to be randomly broken down to present the first logic state or the second logic state.

14. The memory system of claim 12, further comprising an input/output (I/O) circuit operatively coupled to the memory array and configured to:

turn on the first and the second reading transistors of one of the memory cells; and simultaneously apply a programming voltage on a first gate terminal of the first programming transistor of the memory cell.

15. The memory system of claim 11, wherein the first reading transistor is formed in the second one of the plurality of metallization layers that is identical to the first one of the plurality of metallization layers, each of the memory cells further comprising:

a second reading transistor formed in the second one of the plurality of metallization layers, coupled to a second bit line, and gated by a second reading word line.

16. The memory system of claim 15, wherein the first programming transistor is coupled between the first reading transistor and the second reading transistor in series, and wherein the first programming transistor comprises a gate metal and a gate dielectric layer thereunder including a first dielectric portion and a second dielectric portion.

17. The memory system of claim 16, wherein the first dielectric portion is coupled between the gate metal of the first programming transistor and the first reading transistor, and wherein the second dielectric portion is coupled between the gate metal of the first programming transistor and the second reading transistor.

18. The memory system of claim 17, wherein either the first dielectric portion or the second dielectric portion is configured to be randomly broken down, wherein the first dielectric portion is broken down to present the first logic state, and wherein the second dielectric portion is broken down to present the second logic state.

19. A method of fabricating a semiconductor device, comprising:

forming a first reading transistor along a major surface on a frontside of a substrate;

forming a first one of a plurality of metallization layers disposed over the first reading transistor to connect a gate of the first reading transistor to a first reading word line and to connect the first reading transistor to a first bit line;

forming a second one of the plurality of metallization layers over the first one of the plurality of metallization layers;

forming a first programming transistor in the second one of the plurality of metallization layers; and forming a third one of the plurality of metallization layers over the first one of the plurality of metallization layers to connect a gate of the first programming transistor to a first programming word line and to connect the first programming transistor to the first reading transistor.

20. The method of claim 19, further comprising:

concurrently forming a second reading transistor with the first reading transistor along the major surface on the frontside of the substrate; and concurrently forming a second programming transistor with the first programming transistor in the second one of the plurality of metallization layers, wherein the first and the second reading transistors are commonly connected to the first bit line, wherein the first bit line is formed in the first one of the plurality of metallization layers, and wherein the first and the second programming transistors are commonly connected to each other.

* * * * *